(12) United States Patent
Suwada

(10) Patent No.: US 8,286,343 B2
(45) Date of Patent: Oct. 16, 2012

(54) METHOD OF MANUFACTURING A WIRING SUBSTRATE

(75) Inventor: Makoto Suwada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/897,006

(22) Filed: Oct. 4, 2010

(65) Prior Publication Data
US 2011/0078895 A1 Apr. 7, 2011

(30) Foreign Application Priority Data
Oct. 5, 2009 (JP) ................. 2009-231856

(51) Int. Cl.
*H05K 3/02* (2006.01)
(52) U.S. Cl. ............. 29/846; 29/830; 29/832; 29/840
(58) Field of Classification Search ......... 29/825, 29/830, 832, 840, 846
See application file for complete search history.

(56) References Cited

U.S. PATENT DOCUMENTS

| | | | |
|---|---|---|---|
| 6,518,513 B1 * | 2/2003 | Enomoto et al. ............. | 174/262 |
| 7,002,080 B2 * | 2/2006 | Tani et al. .................... | 174/258 |
| 7,627,947 B2 * | 12/2009 | Davis et al. .................. | 29/852 |
| 7,985,930 B2 * | 7/2011 | Asai et al. .................... | 174/264 |
| 2006/0012967 A1 * | 1/2006 | Asai et al. .................... | 361/764 |
| 2008/0176471 A1 | 7/2008 | Ogihara et al. | |

FOREIGN PATENT DOCUMENTS

| JP | 2008-199063 | * | 6/2007 |
| JP | 2008-171834 A | | 7/2007 |

* cited by examiner

*Primary Examiner* — Carl Arbes
(74) *Attorney, Agent, or Firm* — Fujitsu Patent Center

(57) ABSTRACT

A method of manufacturing a wiring substrate includes forming a conducting layer on a first insulating layer including a first glass cloth; forming a photosensitive resist layer on the conducting layer; recognizing a first origin position on the first insulating layer; forming a mask on the resist layer by positioning the mask with respect to the first origin position, the mask being formed so as to position wiring patterns only on positions overlapping the first glass cloth in a planar view; and exposing the resist layer via the mask and forming the wiring patterns only on the positions overlapping the first glass cloth in the planar view.

12 Claims, 24 Drawing Sheets

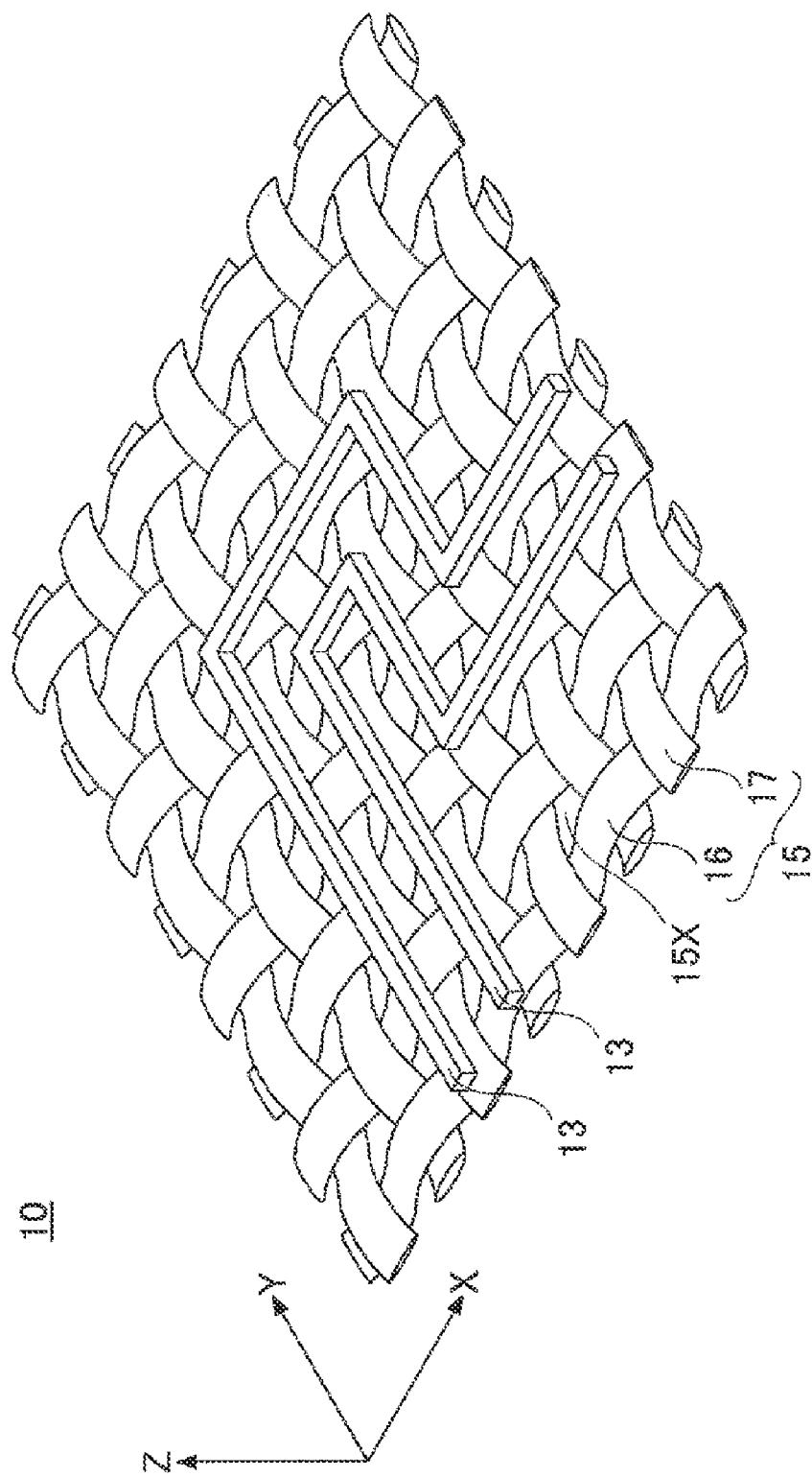

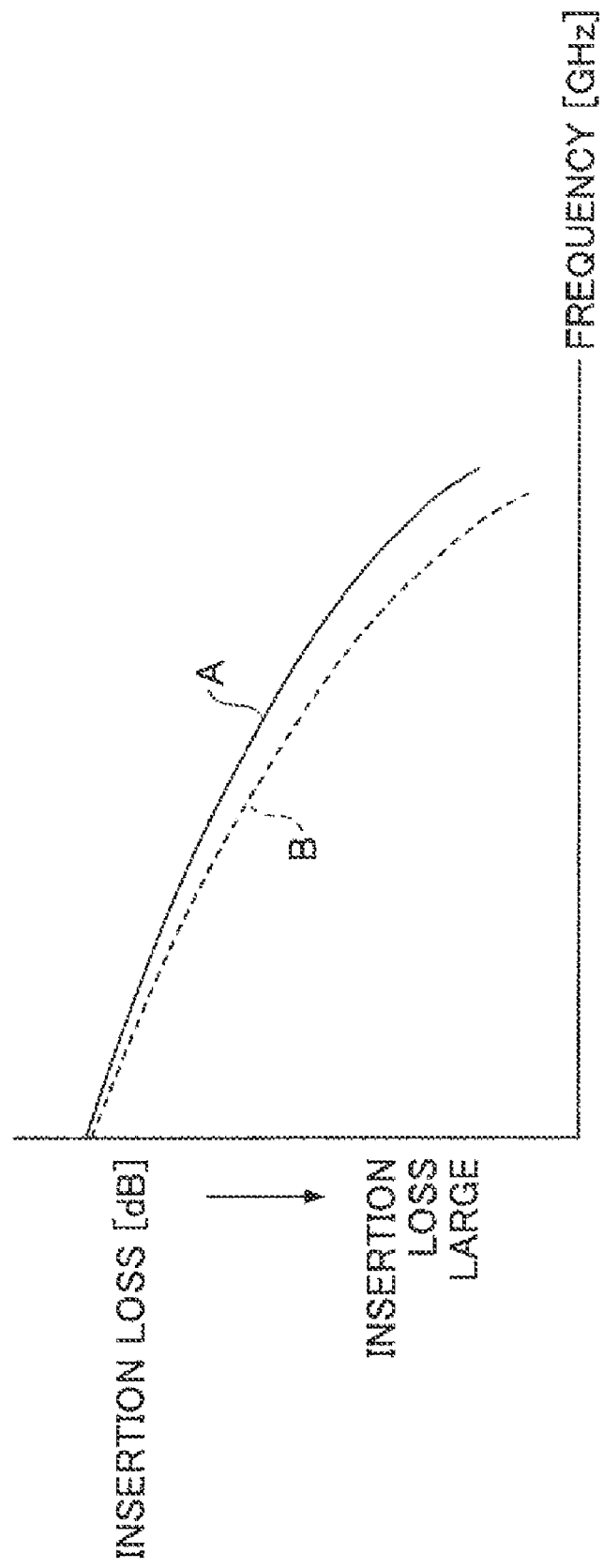

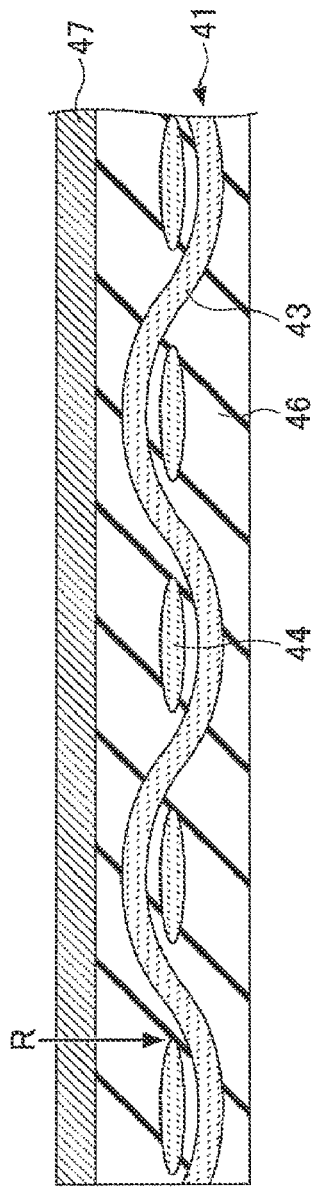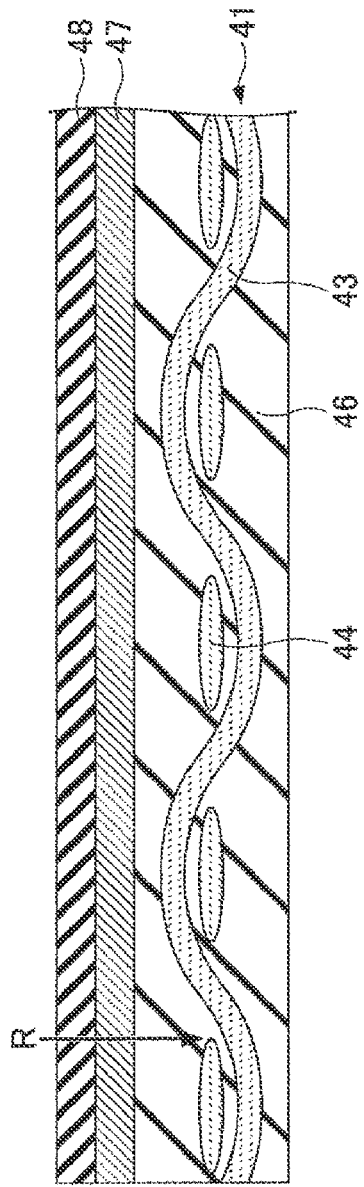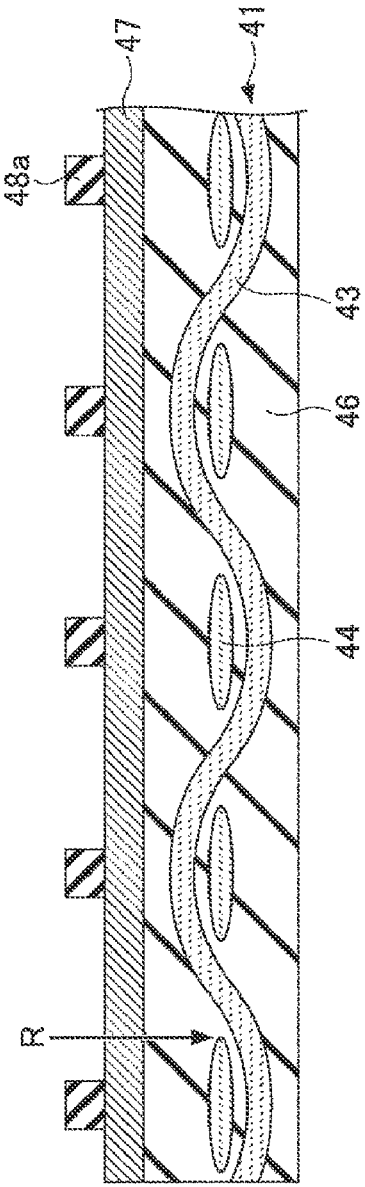

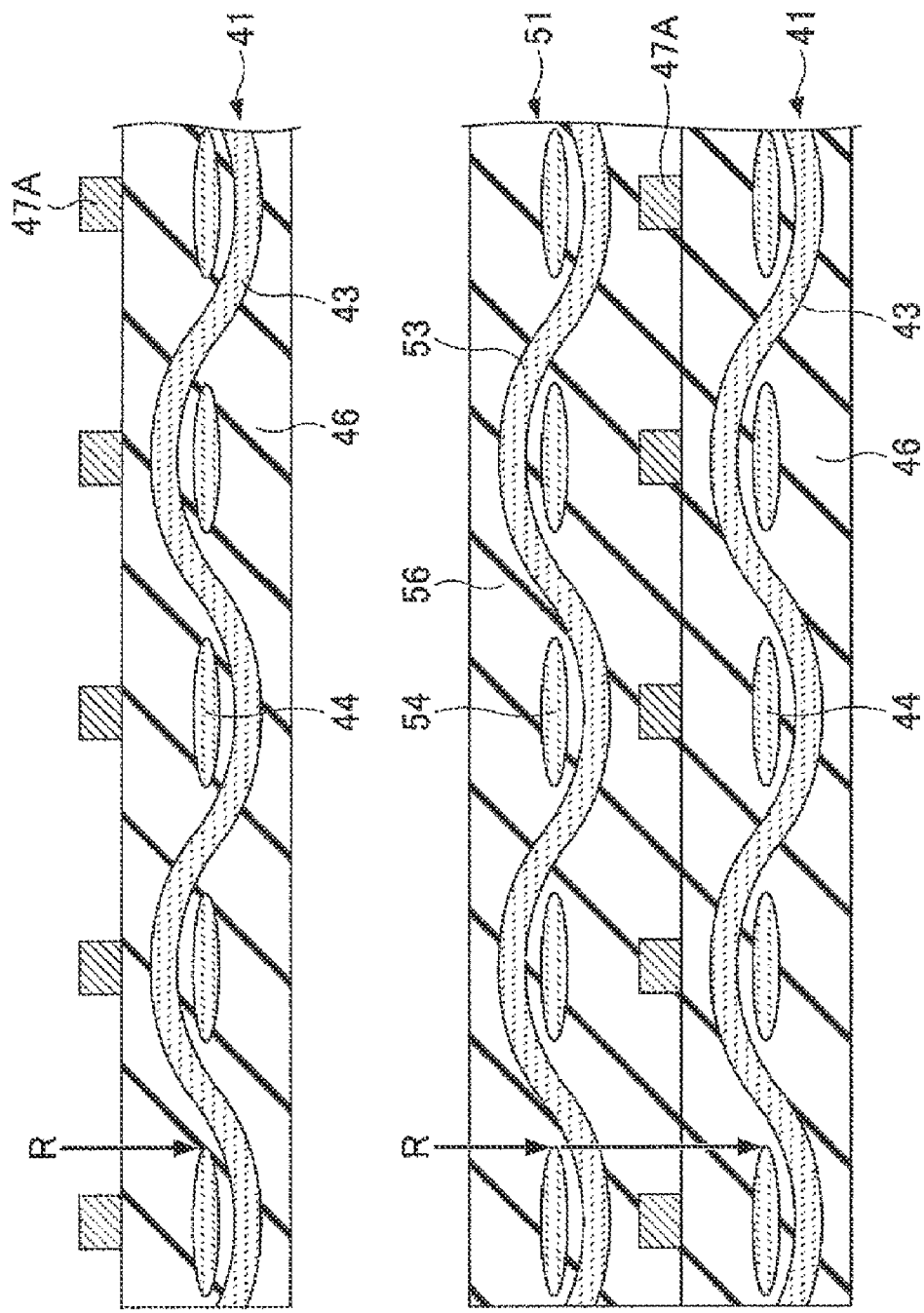

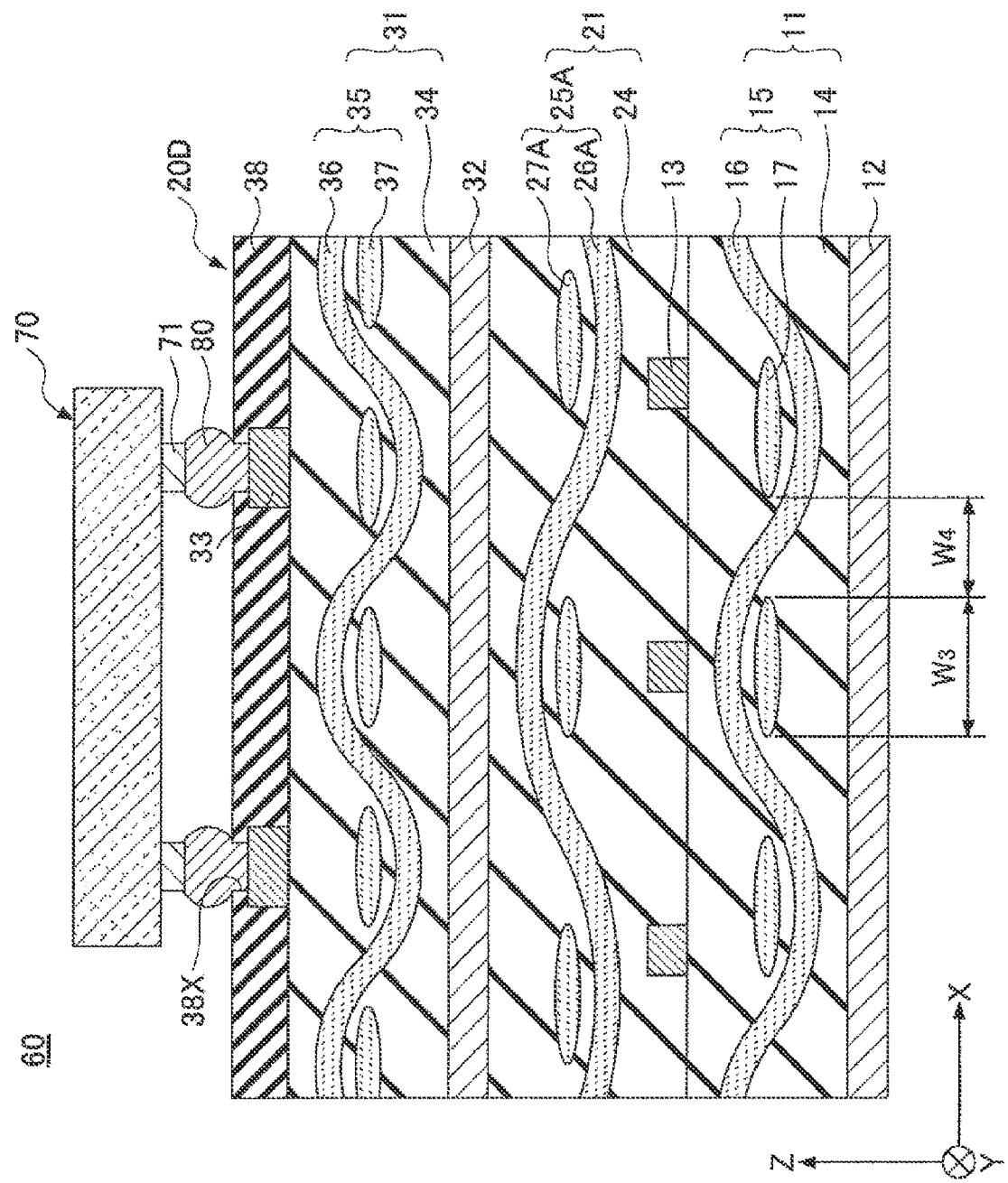

METHOD OF MANUFACTURING A WIRING SUBSTRATE

CROSS-REFERENCE TO RELATED APPLICATIONS

This patent application is based upon and claims the benefit of priority of the prior Japanese Patent Application No. 2009-231856 filed on Oct. 5, 2009, the entire contents of which are incorporated herein by reference.

FIELD

The embodiments discussed herein are related to a manufacturing method and a design method of a wiring substrate on which a wiring pattern is formed on an insulating layer.

BACKGROUND

In recent years and continuing, electric interfaces used in personal computers and servers, etc., are rapidly changing from parallel interfaces to serial interfaces. For example, PCI, ATA, and SCSI, which are parallel interfaces, are changing to PCI Express, Serial ATA, and Serial Attached SCSI, respectively. Furthermore, the transmission frequency in serial interfaces is rapidly increasing. Thus, there is demand for a wiring substrate which has been designed with further consideration of material properties, and which is adaptable to high transmission frequency.

A description is given of an example of a conventional wiring substrate, with reference to accompanying drawings. FIG. 1 is a transparent plan view of main parts of a conventional wiring substrate. FIG. 2 is a cross-sectional view of main parts of the conventional wiring substrate. A wiring pattern 12 and insulating resin 14 illustrated in FIG. 2 are not illustrated in FIG. 1. FIG. 2 is a cross-sectional view cut along a line B-B in FIG. 1.

As illustrated in FIGS. 1 and 2, a conventional wiring substrate 100 includes a prepreg layer 11, the wiring pattern 12, and wiring patterns 130. The wiring patterns 130 are referred to as wiring patterns 130A through 130D.

In the wiring substrate 100, the wiring pattern 12 is formed substantially entirely on one surface (first surface) 11A of the prepreg layer 11. Furthermore, the wiring patterns 130 are formed on selected portions of the other surface (second surface) 11B of the prepreg layer 11. The wiring patterns 130 are conducting bodies through which predetermined electric signals flow. The wiring pattern 12 is a conducting body acting as a return circuit of the predetermined electric signals flowing through the wiring patterns 130.

The prepreg layer 11 includes the insulating resin 14 and a glass cloth 15. The glass cloth 15 is impregnated with the insulating resin 14. The glass cloth 15 includes glass fiber bundles 16 that are disposed in a direction parallel to an X axis and glass fiber bundles 17 that are disposed in a direction parallel to a Y axis. The glass fiber bundles 16 and the glass fiber bundles 17 are plain-woven in a lattice-like manner. For example, each of the glass fiber bundles 16 and 17 is formed by bundling together plural glass fibers that have a width of several μm, so that each of the glass fiber bundles 16 and 17 has a width of approximately several hundred μm. Gap portions 15X are gaps between the glass fiber bundles 16 and 17. The gap portions 15X are filled with the insulating resin 14.

The wiring pattern 130A is formed at a position overlapping one of the glass fiber bundles 17 in a planar view from the second surface 11B of the prepreg layer 11. The wiring pattern 130B is formed at a position overlapping a gap portion adjacent to the glass fiber bundle 17 on which the wiring pattern 130A is formed, in a planar view from the second surface 11B of the prepreg layer 11. The wiring patterns 130C and 130D are formed in a diagonal manner so as not to be parallel with any of the glass fiber bundles 16 and 17 in a planar view from the second surface 11B of the prepreg layer 11. That is to say, the wiring patterns 130A through 130D include parts that are formed at positions overlapping the glass fiber bundles 16 or 17 and parts that are formed on the gap portions 15X that are gaps formed between the glass fiber bundles 16 and 17, in a planar view of the prepreg layer 11.

As indicated in Table 1, the relative permittivity and the dielectric dissipation factor vary depending on whether the wiring patterns 130 (wiring patterns 130A through 130D) are located on the glass fiber bundles 16 or 17 or on the gap portions 15X. When there is a large variation in the relative permittivity in a part where a wiring pattern is formed, the impedance and the propagation delay time vary. When there is a large variation in the dielectric dissipation factor in a part where a wiring pattern is formed, the insertion loss increases. When there are variations in the impedance, variations in the dielectric dissipation factor, and increases in the insertion loss, high frequency signal transmission in a wiring substrate is may not be properly implemented. Therefore, variations in the impedance, variations in the dielectric dissipation factor, and increases in the insertion loss are to be minimized.

TABLE 1

| POSITION OF WIRING PATTERN | RELATIVE PERMITTIVITY | DIELECTRIC DISSIPATION FACTOR |
| --- | --- | --- |
| ON GLASS FIBER BUNDLE 16 OR 17 | LARGE | SMALL |
| ON GAP PORTION 15X | SMALL | LARGE |

The information in Table 1 is applied to the wiring patterns 130A and 130B. The wiring pattern 130A is formed only on the glass fiber bundle 17 (on a position overlapping the glass fiber bundle 17 in a planar view). Therefore, the relative permittivity and the dielectric dissipation factor are fixed and do not vary in a part where the wiring pattern 130A is formed. Accordingly, in the wiring pattern 130A, there are no variations in the impedance or the dielectric dissipation factor, and the insertion loss decreases, such that high frequency signal transmission is implemented with good performance. Thus, the wiring pattern 130A is located at an ideal position.

Meanwhile, the wiring pattern 130B is formed on the glass fiber bundles 16 or 17 (on positions overlapping the glass fiber bundles 16 or 17 in a planar view), as well as on the gap portions 15X (on positions overlapping the gap portions 15X in a planar view). Therefore, the wiring pattern 130B alternately passes over parts where the relative permittivity is large and the dielectric dissipation factor is small, and parts where the relative permittivity is small and the dielectric dissipation factor is large. Accordingly, when a current flows through the wiring pattern 130B, the impedance and the propagation delay time vary, and the insertion loss increases, such that high frequency signal transmission is implemented with bad performance.

There are cases where the wiring patterns 130A and 130B are used for transmitting differential signals. Differential signals include POS signals and NEG signals obtained by inverting POS signals, and are particularly used for high frequency signal transmission. For example, POS signals flow through the wiring pattern 130A, and NEG signals flow through the wiring pattern 130B that is disposed in parallel with the wiring pattern 130A. If the variation in the impedance, the variation in the propagation delay time, and the insertion loss are the same for the wiring patterns 130A and 130B, high frequency signal transmission is implemented with good performance.

However, as described above, in the wiring pattern 130A, there are no variations in the impedance or the propagation delay time, and the insertion loss is small. Meanwhile, in the wiring pattern 130B, there are variations in the impedance and the propagation delay time, and the insertion loss is large. Consequently, if the wiring patterns 130A and 130B are used for transmitting differential signals, the balance between the wiring patterns 130A and 130B (balance between POS signals and NEG signals) is disrupted, and therefore high frequency signal transmission is implemented with bad performance. Similarly, when the wiring patterns 130C and 130D are used for transmitting differential signals, the balance between the wiring patterns 130C and 130D (balance between POS signals and NEG signals) is disrupted, and therefore high frequency signal transmission is implemented with bad performance.

As described above, when two wiring patterns are used for transmitting differential signals, but only one of the wiring patterns is located at an ideal position in consideration of high frequency signal transmission, high frequency signal transmission is not be implemented with good performance. That is to say, when wiring patterns are used for transmitting differential signals, both of the parallel wiring patterns are to be located at ideal positions in consideration of high frequency signal transmission, so that high frequency signal transmission is implemented with good performance. An "ideal position in consideration of high frequency signal transmission" means that the wiring pattern is formed only on positions overlapping a part of the glass cloth 15 (i.e., not on positions overlapping any of the gaps) in a planar view of the prepreg layer 11.

Next, the wiring patterns 130C and 130D are discussed. Similar to the wiring pattern 130B, the wiring patterns 130C and 130D are formed on the glass fiber bundles 16 or 17 (on positions overlapping the glass fiber bundles 16 or 17 in a planar view), as well as on the gap portions 15X (on positions overlapping the gap portions 15X in a planar view). Therefore, each of the wiring patterns 130C and 130D alternately passes over parts where the relative permittivity is large and the dielectric dissipation factor is small, and parts where the relative permittivity is small and the dielectric dissipation factor is large. However, compared to the case of wiring pattern 130B, the positions on which the wiring patterns 130C and 130D are formed include more parts overlapping the glass fiber bundles 16 or 17 and fewer parts overlapping the gap portions 15X. Consequently, the difference between the wiring patterns 130C and 130D is smaller than the difference between the wiring patterns 130A and 130B in terms of propagation delay time. Therefore, with the wiring patterns 130C and 130D, high frequency signal transmission is implemented with better properties than those of the wiring patterns 130A and 130B.

Accordingly, in a conventional wiring substrate, the difference in propagation delay time between wiring patterns is reduced by disposing the wiring patterns in diagonal directions with respect to the horizontal and vertical directions of the glass fiber bundles in a planar view (see, for example, Japanese Laid-Open Patent Application No. 2008-171834).

In the above-described conventional wiring substrate (with diagonal wiring patterns), more parts of the wiring patterns are located on positions overlapping the glass fiber (as compared with horizontal or vertical diagonal wiring patterns); however, there still remain parts where the wiring patterns are located on gaps between the glass fibers. The relative permittivity and the dielectric dissipation factor are different for parts on the glass fiber of the wiring substrate and parts on the gaps. Thus, when a wiring pattern is located on both the glass fiber and gaps between the glass fibers, and a current flows through such a wiring pattern, variations in the impedance, variations in the propagation delay time, and the insertion loss may not be sufficiently mitigated.

SUMMARY

According to an aspect of the invention, a method of manufacturing a wiring substrate includes forming a conducting layer on a first insulating layer including a first glass cloth; forming a photosensitive resist layer on the conducting layer; recognizing a first origin position on the first insulating layer; forming a mask on the resist layer by positioning the mask with respect to the first origin position, the mask being formed so as to position wiring patterns only on positions overlapping the first glass cloth in a planar view; and exposing the resist layer via the mask and forming the wiring patterns only on the positions overlapping the first glass cloth in the planar view.

According to an aspect of the invention, a method of designing a wiring substrate includes acquiring first information relevant to a first glass cloth included in a first insulating layer adjacent to wiring patterns; determining a first origin position on the first insulating layer; calculating a first region of the first glass cloth with respect to the first origin position based on the first information acquired in said acquiring the first information; and determining the first region of the first glass cloth as a wiring pattern layout region in which it is possible to form the wiring patterns.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 5 is a perspective transparent view of main parts of the wiring substrate according to the first embodiment of the present invention;

FIG. 6 illustrates an example of the difference in insertion loss of an S parameter between the wiring substrate according to the first embodiment of the present invention and a conventional wiring substrate;

FIGS. 19A through 19E illustrate procedures for manufacturing the wiring substrate according to the first embodiment of the present invention (part 5);

FIG. 23 is a cross-sectional view of a semiconductor device according to a third embodiment of the present invention.

DESCRIPTION OF EMBODIMENTS

Preferred embodiments of the present invention will be explained with reference to accompanying drawings.

First Embodiment

Figure 1:
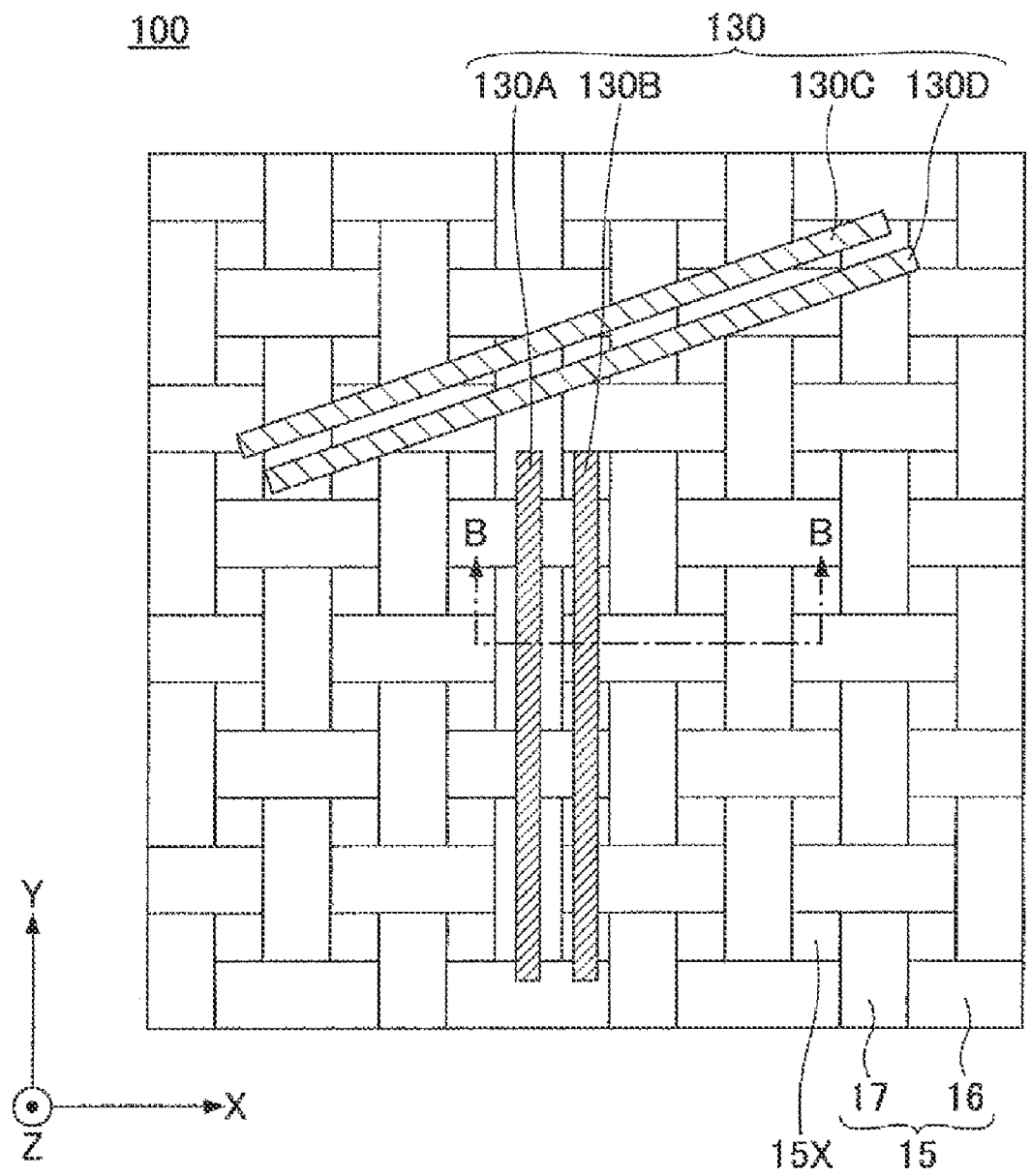
FIG. 1 is a transparent plan view of main parts of a conventional wiring substrate.
Figure 2:
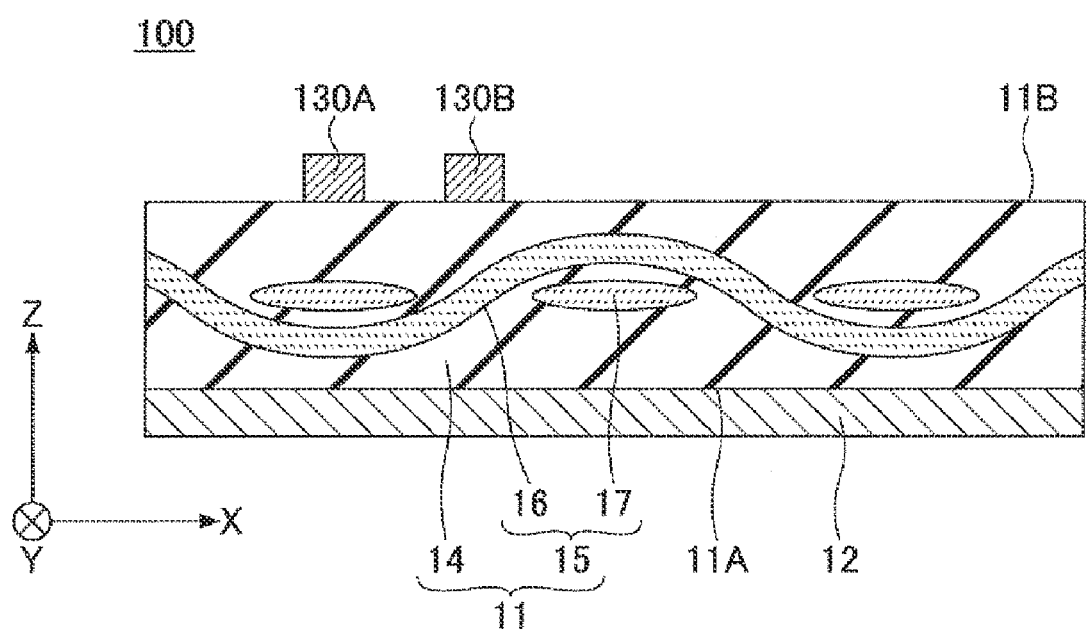
FIG. 2 is a cross-sectional view of main parts of the conventional wiring substrate.
Figure 3:
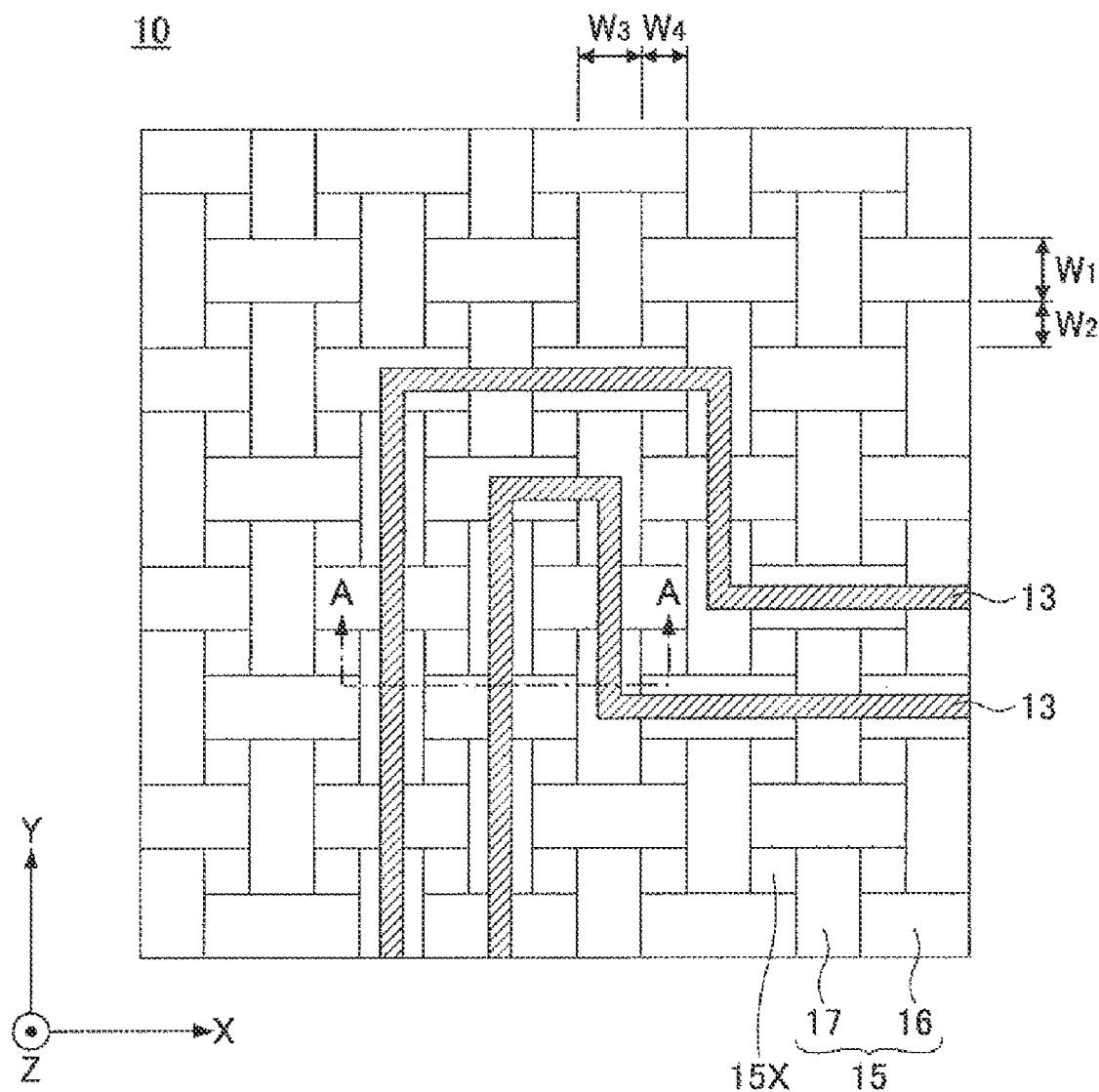
FIG. 3 is a transparent plan view of main parts of a wiring substrate according to a first embodiment of the present invention.
Figure 4:
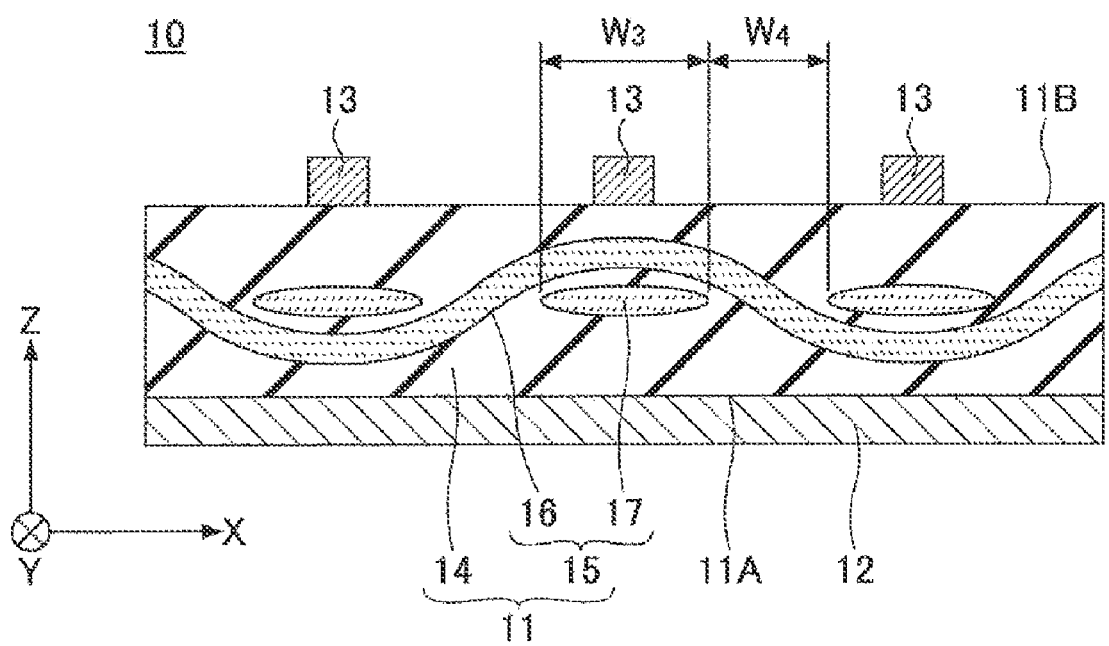
FIG. 4 is a cross-sectional view of main parts of the wiring substrate according to the first embodiment of the present invention.

FIG. 3 is a transparent plan view of main parts of a wiring substrate according to a first embodiment of the present invention. FIG. 4 is a cross-sectional view of main parts of the wiring substrate according to the first embodiment of the present invention. FIG. 5 is a perspective transparent view of main parts of the wiring substrate according to the first embodiment of the present invention. A wiring pattern 12 and insulating resin 14 illustrated in FIG. 4 are not illustrated in FIG. 3 or 5. FIG. 4 is a cross-sectional view cut along a line A-A in FIG. 3.

As illustrated in FIGS. 3 through 5, a wiring substrate 10 includes a prepreg layer 11, the wiring pattern 12, and wiring patterns 13. The wiring pattern 12 is formed substantially entirely on the first surface 11A of the prepreg layer 11. Furthermore, the wiring patterns 13 are formed on selected portions of the second surface 11B of the prepreg layer 11. The wiring patterns 13 are conducting bodies through which predetermined electric signals flow. The wiring pattern 12 is a conducting body acting as a return circuit of the predetermined electric signals flowing through the wiring patterns 13. The materials forming the wiring patterns 12 and 13 are not particularly limited as long as conducting bodies are formed. For example, the wiring patterns 12 and 13 may be made of Cu, Al, Au, Ag, or the like.

The prepreg layer 11 includes the insulating resin 14 and a glass cloth 15. The glass cloth 15 is impregnated with the insulating resin 14. The insulating resin 14 may be made of a material such as epoxy resin, polyimide resin, polyester resin, or the like. The insulating resin 14 may include a filler such as silica, alumina, or the like.

The glass cloth 15 includes glass fiber bundles 16 having a width $W_1$ that are disposed in a direction parallel to an X axis at intervals of $W_2$, and glass fiber bundles 17 having a width $W_3$ that are disposed in a direction parallel to a Y axis at intervals of $W_4$. The glass fiber bundles 16 and the glass fiber bundles 17 are plain-woven in a lattice-like manner. For example, each of the glass fiber bundles 16 and 17 is formed by bundling together plural glass fibers that have a width of several μm, so that each of the glass fiber bundles 16 and 17 has a width of approximately several hundred μm. Gap portions 15X are gaps between the glass fiber bundles 16 and 17. The gap portions 15X are filled with the insulating resin 14.

In the example illustrated in FIGS. 3 through 5, the prepreg layer 11 includes the glass fiber bundles 16 and 17; however, the prepreg layer 11 may include any kind of fiber bundle other than the glass fiber bundles 16 and 17. A fiber bundle is formed by bundling together plural fibers. Examples of fiber bundles other than glass fiber bundles are carbon fiber bundles, polyester fiber bundles, Tetron fiber bundles, nylon fiber bundles, aramid fiber bundles, or the like. The method of weaving the fiber bundles is not limited to plain-weaving; the fiber bundles may be woven by sateen weaving, twill weaving, or the like. The fiber bundles may be interwoven at an angle other than 90 degrees.

In the wiring substrate 10, the wiring patterns 13 are formed only on positions overlapping any part of the glass cloth 15 in a planar view from the second surface 11B of the prepreg layer 11; the wiring patterns 13 are not formed on any positions overlapping the gap portions 15X of the glass cloth 15 in a planar view. Consequently, when a current flows through the wiring patterns 13 of the wiring substrate 10, variations in the impedance, variations in the propagation delay time, and the insertion loss are further mitigated than those of the conventional wiring substrate. In consideration of positional shifts, the wiring pattern 13 is disposed such that the center of the wiring pattern 13 in the width direction (lateral direction) of the wiring pattern 13 substantially coincides with the center of the glass fiber bundle 16 or 17 in the width direction (lateral direction) of the glass fiber bundle 16 or 17. Incidentally, a planar view means a view from a + direction to a − direction (or from a − direction to a + direction) along a Z axis indicated in FIGS. 3 through 5.

As described above in the BACKGROUND, in the conventional wiring substrate, when wiring patterns are disposed diagonally with respect to the horizontal and vertical glass fiber bundles in a planar view, more parts of the wiring patterns are located on positions overlapping the glass fiber (as compared with horizontal or vertical diagonal wiring patterns). However, there still remain parts where the wiring patterns are located on gaps between the glass fibers. Thus, when a current flows through such wiring patterns, variations in the impedance, variations in the propagation delay time, and the insertion loss may not be sufficiently mitigated.

Meanwhile, in the wiring substrate 10 according to the first embodiment of the present invention, the wiring pattern is consistently formed only on positions overlapping any part of the glass cloth 15 in a planar view. Consequently, regardless of whether the wiring patterns 13 are used for transmitting differential signals, variations in the impedance, variations in the propagation delay time, and the insertion loss are constantly and significantly mitigated whenever a current flows through the wiring patterns 13. Therefore, high frequency signal transmission is constantly implemented with good performance.

In the following, an example is given of the difference in properties between the wiring substrate according to the first embodiment of the present invention and a conventional wiring substrate. FIG. 6 illustrates an example of the difference in insertion loss of an S parameter between the wiring substrate according to the first embodiment of the present invention and a conventional wiring substrate. In FIG. 6, A indicates the insertion loss of an S parameter of the wiring substrate according to the first embodiment of the present invention, and B indicates the insertion loss of an S parameter of the conventional wiring substrate. In FIG. 6, the insertion loss is larger toward the direction indicated by the arrow. As illustrated in FIG. 6, the effect of reducing the insertion loss as the frequency increases is greater in the case of the wiring substrate according to the first embodiment of the present invention than in the case of the conventional wiring substrate.

Figure 7A:
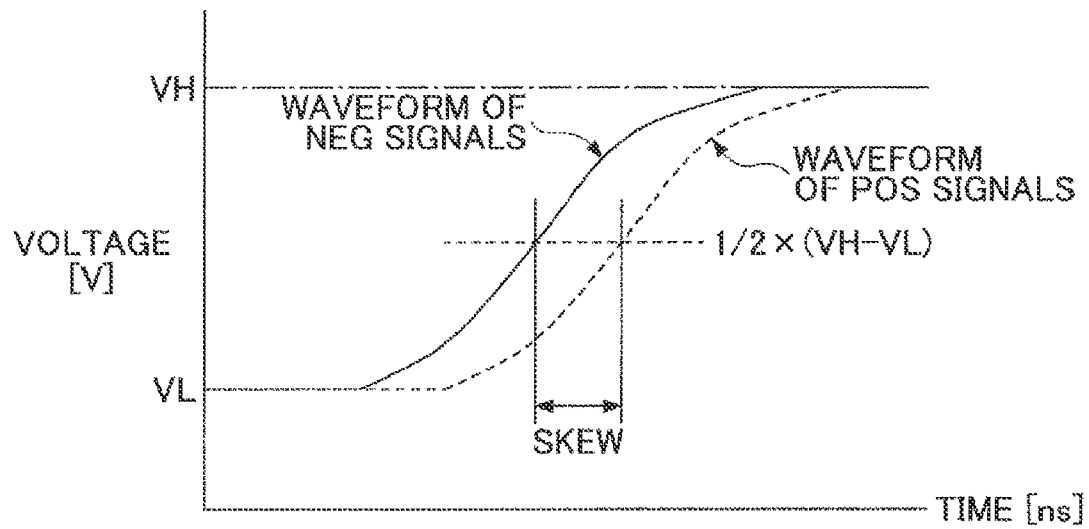
FIGS. 7A and 7B illustrate examples of skews between POS signals and NEG signals.
Figure 7B:
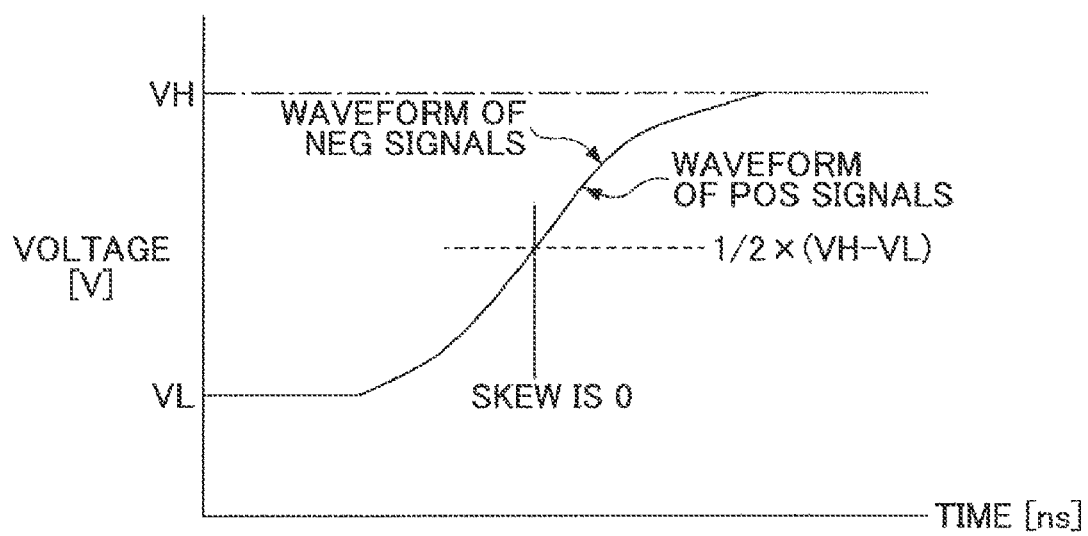

FIGS. 7A and 7B illustrate examples of skews between POS signals and NEG signals. FIG. 7A illustrates a skew of a conventional wiring substrate and FIG. 7B illustrates a skew of the wiring substrate according to the first embodiment of the present invention. A skew corresponds to the difference between input pulse signals in terms of response time (between POS signals and NEG signals). Specifically, the pulse signals stand up between a voltage VL and a voltage VH in wiring patterns used for transmitting differential signals. The difference in the response time is defined at a voltage of $\frac{1}{2} \times (VH-VL)$.

As described above, in a conventional wiring substrate, the balance between the wiring patterns used for transmitting differential signals (the balance between POS signals and NEG signals) is disrupted. Therefore, a skew occurs as illustrated in FIG. 7A. Meanwhile, in the wiring substrate according to the first embodiment of the present invention, the wiring patterns are only formed on positions overlapping the glass fiber bundles in a planar view. Consequently, the balance between the wiring patterns used for transmitting differential signals (the balance between POS signals and NEG signals) is not disrupted. Therefore, a skew does not occur as illustrated in FIG. 7B. In FIG. 7B, the POS signal waveform and the NEG signal waveform completely coincide with each other. Skews cause common mode noise, and therefore skews are preferably prevented from occurring. Hence, high frequency signal transmission is performed with better performance in the wiring substrate according to the first embodiment of the present invention, in which skews do not occur, than in the conventional wiring substrate in which skews occur.

Figure 8:
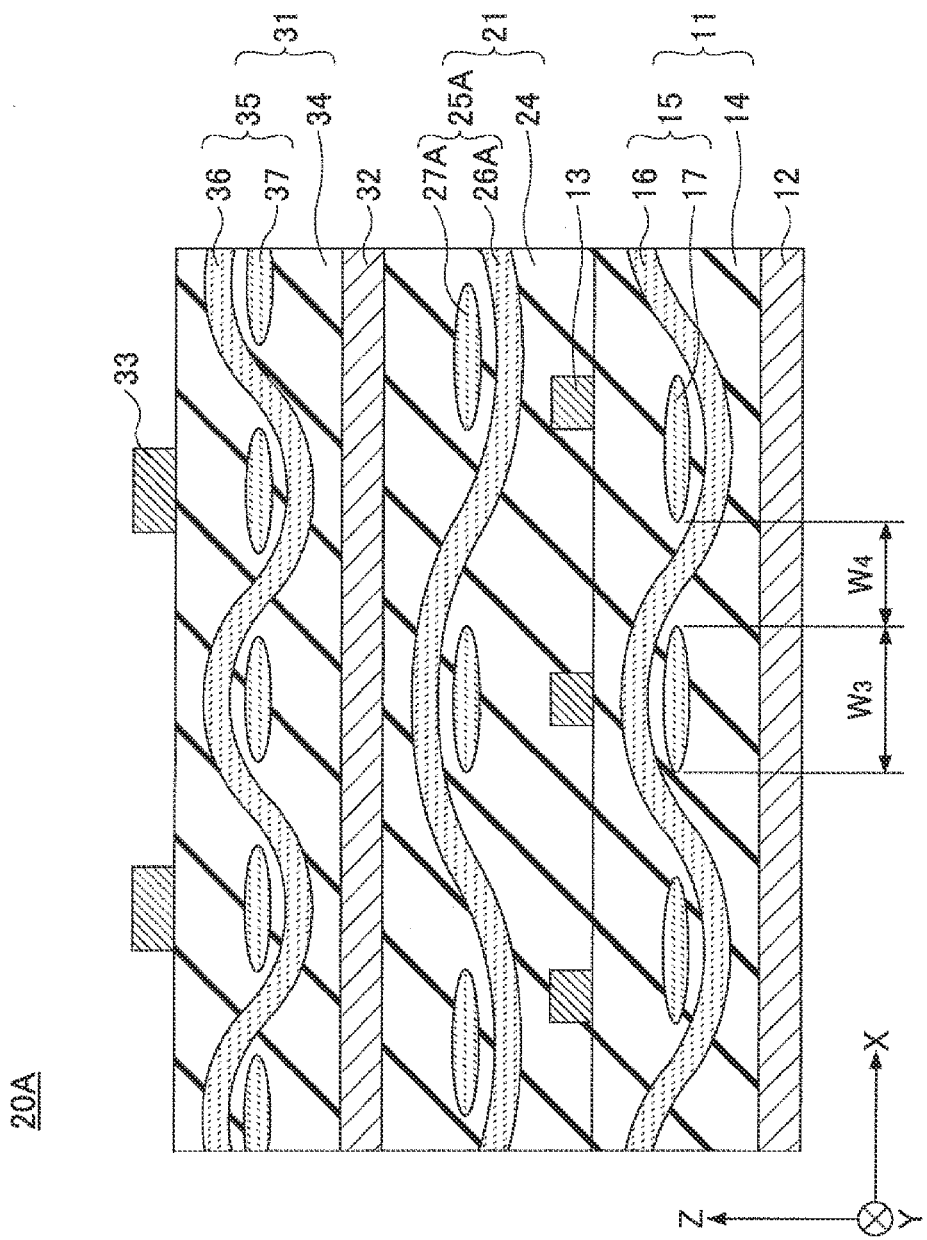
FIG. 8 is a cross-sectional view of an example of a wiring substrate including four layers.

In the above description of the wiring substrate according to the first embodiment of the present invention, the wiring substrate 10 of FIG. 3, etc., includes two wiring layers. However, the wiring substrate according to the first embodiment of the present invention is not limited to including two layers; there may be n layers included in the wiring substrate (n being a natural number). A supplementary description is given of a wiring substrate 20A including four layers as illustrated in FIG. 8. In FIG. 8, elements corresponding to those of FIG. 4 are denoted by the same reference numerals and may not be further described.

In the wiring substrate 20A, a core layer 21, a wiring pattern 32, a prepreg layer 31, and wiring patterns 33 are sequentially laminated on the wiring substrate 10 illustrated in FIG. 4. The wiring pattern 32 is formed substantially entirely on the core layer 21, and the wiring patterns 33 are formed on selected portions of the prepreg layer 31. The wiring patterns 33 are conducting bodies through which predetermined electric signals flow. The wiring pattern 32 is a conducting body acting as a return circuit of the predetermined electric signals flowing through the wiring patterns 33. The materials forming the wiring patterns 32 and 33 are not particularly limited as long as conducting bodies are formed. For example, the wiring patterns 32 and 33 may be made of Cu, Al, Au, Ag, or the like.

The core layer 21 is an insulating layer including insulating resin 24 and a glass cloth 25A. The insulating resin 24 may be made of a material such as epoxy resin, polyimide resin, polyester resin, or the like. The insulating resin 24 may include a filler such as silica, alumina, or the like.

The prepreg layer 31 is an insulating layer including insulating resin 34 and a glass cloth 35. The insulating resin 34 may be made of a material such as epoxy resin, polyimide resin, polyester resin, or the like. The insulating resin 34 may include a filler such as silica, alumina, or the like.

Similar to the glass cloth 15, the glass cloth 25A includes glass fiber bundles 26A having a predetermined width that are disposed in a direction parallel to an X axis at predetermined intervals, and glass fiber bundles 27A having a predetermined width that are disposed in a direction parallel to a Y axis at predetermined intervals. The glass fiber bundles 26A and the glass fiber bundles 27A are plain-woven in a lattice-like manner. Similar to the glass cloth 15, the glass cloth 35 includes glass fiber bundles 36 having a predetermined width that are disposed in a direction parallel to an X axis at predetermined intervals, and glass fiber bundles 37 having a predetermined width that are disposed in a direction parallel to a Y axis at predetermined intervals. The glass fiber bundles 36 and the glass fiber bundles 37 are plain-woven in a lattice-like manner. However, in the glass cloth 25A, the intervals between adjacent glass fiber bundles 27A are different from the intervals $W_4$ between adjacent glass fiber bundles 17.

As described above, when two insulating layers (the prepreg layer 11 and the core layer 21) are adjacent to the wiring patterns 13, the wiring patterns 13 are to be formed only on positions overlapping both the glass cloth 15 and the glass cloth 25A included in the two adjacent insulating layers, in a planar view. Accordingly, when a current flows through the wiring patterns 13, variations in the impedance, variations in the propagation delay time, and the insertion loss are mitigated.

In the example of FIG. 8, as long as the wiring patterns 13 are formed on positions overlapping both glass cloths 15 and 25A in the adjacent insulating layers in a planar view, the width of the glass fiber bundles 26A and the width of the glass fiber bundles 16 may not be equal. Furthermore, the width of the glass fiber bundles 27A and the width of the glass fiber bundles 17 may not be equal.

Next, a description is given of a design method and a manufacturing method of the wiring substrate 10 according to the first embodiment of the present invention, in which the wiring patterns are only formed on positions overlapping the glass cloth in a planar view. First, a description is given of a wiring design/manufacturing system used for designing and manufacturing the wiring substrate. Next, a description is given of the design method and the manufacturing method of the wiring substrate.

Figure 9:
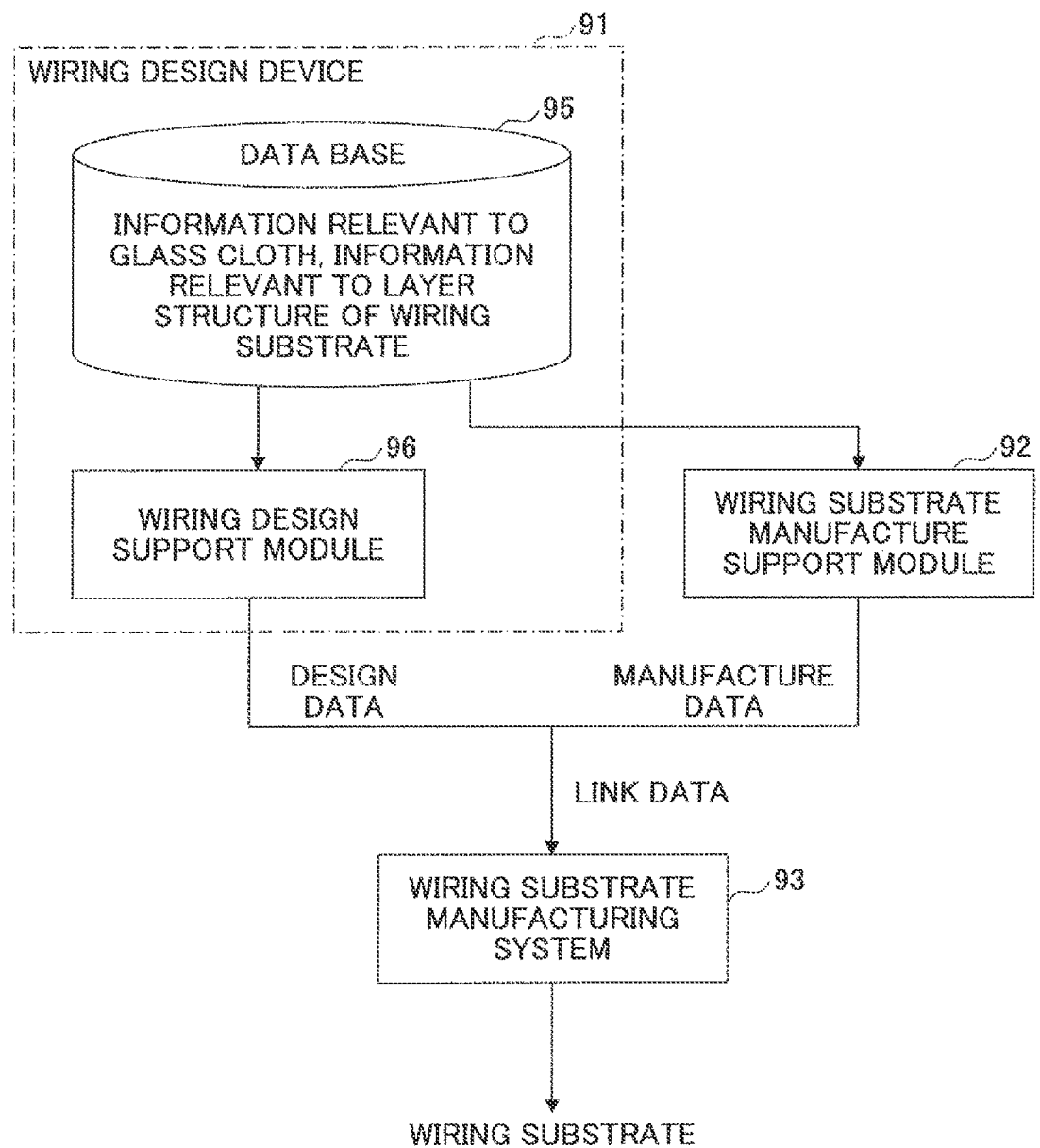
FIG. 9 is a block diagram of a wiring design/manufacturing system used for designing and manufacturing the wiring substrate according to the first embodiment of the present invention.

FIG. 9 is a block diagram of the wiring design/manufacturing system used for designing and manufacturing the wiring substrate according to the first embodiment of the present invention. As illustrated in FIG. 9, a wiring design/manufacturing system 90 includes a wiring design device 91, a wiring substrate manufacture support module 92, and a wiring substrate manufacturing system 93.

The wiring design device 91 is for disposing (laying out) the wiring patterns at selected positions in a predetermined insulating layer of the wiring substrate. The wiring design device 91 includes a data base 95 and a wiring design support module 96. The data base 95 has a function of storing various kinds of information regarding a wiring substrate that is the design target. Examples of various kinds of information are information regarding the glass cloth included in the wiring substrate as indicated in Table 2 (the thickness of the insulating layer, the width and intervals of the glass fiber bundles), and information regarding the layer structure of the wiring substrate as indicated in Table 3. Table 3 indicates an example of a wiring substrate including eight layers, and "V/G" indicates the power source or GND.

TABLE 2

| INSU-<br>LATING<br>LAYER | THICK-<br>NESS<br>[mm] | GLASS FIBER<br>BUNDLE IN<br>X DIRECTION | | GLASS FIBER<br>BUNDLE IN<br>Y DIRECTION | |
|---|---|---|---|---|---|
| | | WIDTH<br>$W_1$<br>[μm] | INTERVAL<br>$W_2$<br>[μm] | WIDTH<br>$W_3$<br>[μm] | INTERVAL<br>$W_4$<br>[μm] |
| CORE<br>LAYER A | 0.06 | 400 | 150 | 350 | 100 |
| PREPREG<br>LAYER A | 0.06 | 400 | 150 | 350 | 100 |

TABLE 3

| LAYER | WIRING PATTERN,<br>INSULATING LAYER | SIGNAL,<br>V/G |
|---|---|---|
| 8 | WIRING PATTERN | SIGNAL |
| | PREPREG LAYER A | — |
| 7 | WIRING PATTERN | V/G |
| | CORE LAYER A | — |
| 6 | WIRING PATTERN | SIGNAL |
| | PREPREG LAYER A | — |
| 5 | WIRING PATTERN | V/G |
| | CORE LAYER A | — |
| | PREPREG LAYER A | — |
| | CORE LAYER A | — |
| 4 | WIRING PATTERN | V/G |
| | PREPREG LAYER A | — |
| 3 | WIRING PATTERN | SIGNAL |
| | CORE LAYER A | — |
| 2 | WIRING PATTERN | V/G |
| | PREPREG LAYER A | — |
| 1 | WIRING PATTERN | SIGNAL |

The wiring design support module 96 has a function of designing the wiring based on various information items acquired from the data base 95. The design data formed as a result of designing the wiring by the wiring design support module 96 is output to the wiring substrate manufacturing system 93. Designing the wiring means to dispose the wiring patterns, corresponding to circuit design data, at selected positions on a predetermined insulating layer in the wiring substrate.

The wiring design support module 96 includes, for example, a CPU, a ROM, and a main memory (not illustrated). Various functions of the wiring design support module 96 (see FIG. 10) are implemented by loading the programs recorded in the ROM into the main memory, and executing the programs by the CPU. The programs recorded in the ROM may execute the procedures of steps S201 through S206 described below. However, part of or all of the wiring design support module 96 may be implemented by hardware. Furthermore, the wiring design support module 96 may include plural physical devices.

The wiring substrate manufacture support module 92 has functions of outputting manufacture data used for manufacturing the wiring substrate and supporting the process of manufacturing the wiring substrate. The manufacture data includes size data for dividing the wiring substrate into separate pieces and data for exposing the photoresist layer. The wiring substrate manufacturing system 93 is for manufacturing a wiring substrate and includes an exposure device, an alignment device, and an etching device.

The design data output from the wiring design device 91 and the manufacture data output from the wiring substrate manufacture support module 92 are linked and input to the wiring substrate manufacturing system 93, so that the wiring substrate is manufactured.

Figure 10:
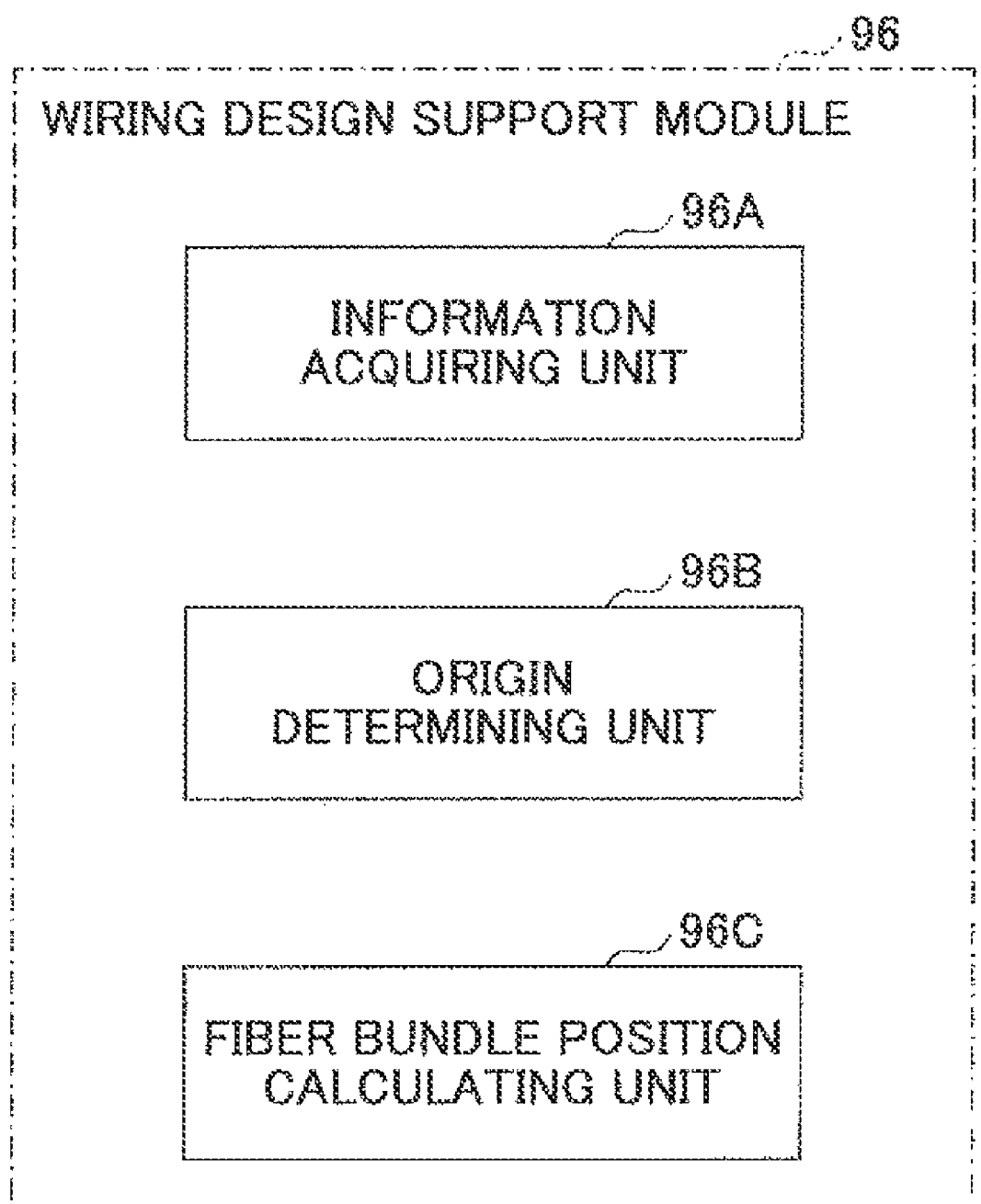
FIG. 10 is a functional block diagram of a wiring design support module illustrated in FIG. 9.
Figure 11:
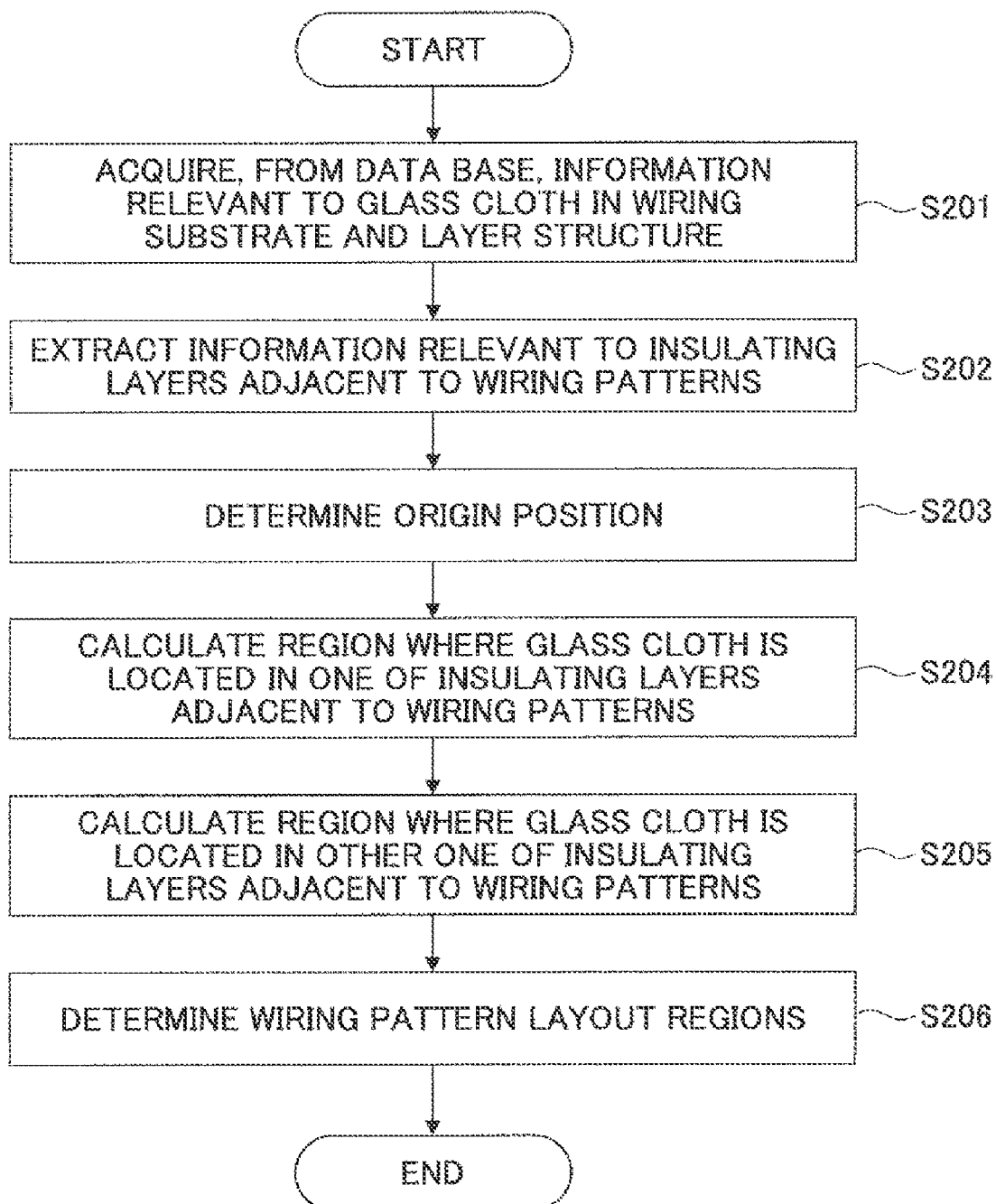
FIG. 11 is a flowchart for designing the wiring substrate.

A detailed description is given of the method of designing a wiring substrate with reference to a functional block diagram of the wiring design support module 96 of FIG. 10 and a flowchart for designing the wiring of FIG. 11. In this example, wiring patterns (third layer) are disposed at selected positions between a core layer A and a prepreg layer A, in the wiring substrate having eight layers indicated in table 3 (referred to as wiring substrate 40, as a matter of convenience). Reference may be made to figures other than FIGS. 10 and 11.

First, in step S201, an information acquiring unit 96A acquires, from the data base 95, information indicated in table 2 relevant to a glass cloth in the wiring substrate 40, and acquires information indicated in table 3 relevant to the layer structure of the wiring substrate 40.

Next, in step S202, the information acquiring unit 96A extracts, from the information acquired in step S201, information relevant to insulating layers (core layer A and prepreg layer A) adjacent to the wiring patterns (third layer) to be designed.

Figure 12:
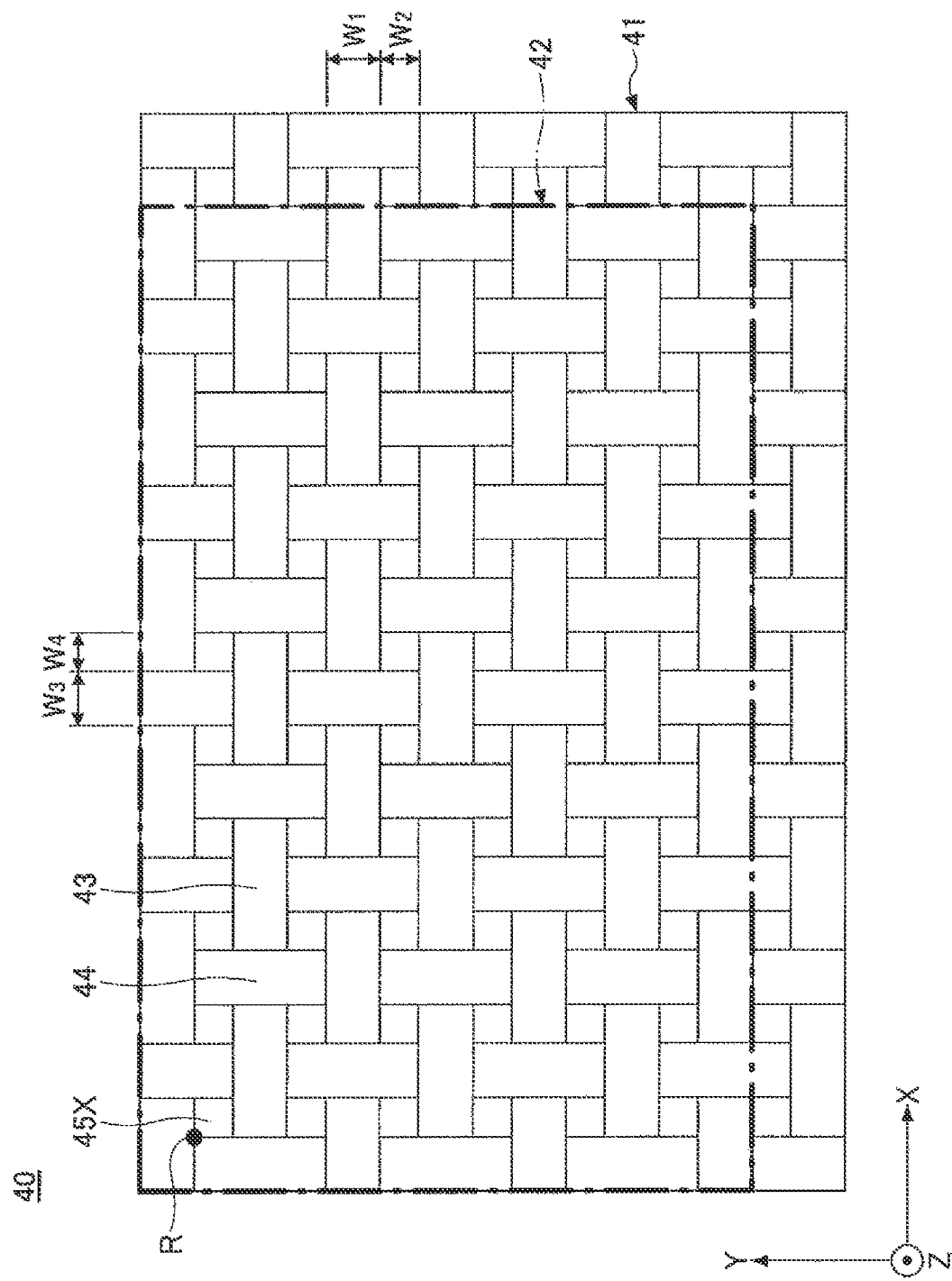
FIG. 12 is for describing an origin of the wiring substrate.

Next, in step S203, an origin determining unit 96B determines the origin on the original version of the core layer A (the core layer A before being cut into a particular size) and the origin on the original version of the prepreg layer A (the prepreg layer A before being cut into a particular size). The origin may be at any position; for example, as illustrated in FIG. 12, an origin R may be located at an intersection point in the glass cloth (an apex of a gap portion 45X formed by a glass fiber bundle 43 and a glass fiber bundle 44). In FIG. 12, 41 denotes the original version of the core layer A, 42 denotes a region of the core layer A after being cut, 43 denotes the glass fiber bundles that are disposed in a direction parallel to an X axis, 44 denotes the glass fiber bundles that are disposed in a direction parallel to an Y axis, and R denotes an origin position. Furthermore, $W_1$ denotes the width of the glass fiber bundles 43, $W_2$ denotes the intervals between of the glass fiber bundles 43, $W_3$ denotes the width of the glass fiber bundles 44, and $W_4$ denotes the intervals between of the glass fiber bundles 44. The origin position of the prepreg layer A and the origin position R of the core layer A are determined to be at the same positions.

However, the origin position R is not limited to the position as indicated in FIG. 12. For example, the origin position R may be at another apex of the gap portion 45X formed by the glass fiber bundle 43 and the glass fiber bundle 44, or at a center point in a region where the glass fiber bundle 43 and the glass fiber bundle 44 overlap each other in a planar view. The following description is given based on the example of FIG. 12.

Referring back to FIG. 11, in step S204, a fiber bundle position calculating unit 96C calculates the region where the glass cloth (glass fiber bundles 43 and glass fiber bundles 44) is located with respect to the origin position, in one of the insulating layers (core layer A) adjacent to the wiring patterns (third layer) to be designed. The calculation is performed based on the information extracted at step S202 and the origin position determined at step S203. In this example, the position at the center of each glass fiber bundle in the width direction is calculated. The region where the glass cloth is located is calculated based on the center position of each glass fiber bundle 43 in the width direction and information relevant to the glass fiber bundles extracted at step S202.

The center position of each glass fiber bundle 43 in the width direction with respect to the origin position is calculated by the following formula, where m is zero or an integer of one or more.

$$W_1/2 + W_2 + m \times (W_1 + W_2) \quad \text{(formula 1)}$$

By substituting the values indicated in table 2 into formula 1, the following is obtained.

$$W_1/2 + W_2 + m \times (W_1 + W_2) = 400/2 + 150 + m \times (400 + 150) = 350 + m \times 550$$

That is to say, the center positions of the glass fiber bundles 43 in the width direction are located at 350 µm, 900 µm, 1450 µm . . . in a Y− direction from the origin position (toward the bottom of the sheet on which FIG. 12 is depicted).

Furthermore, the center position of each glass fiber bundle 44 in the width direction with respect to the origin position is calculated by the following formula, where m is zero or an integer of one or more.

$$W_3/2 + W_4 + m \times (W_3 + W_4) \quad \text{(formula 2)}$$

By substituting the values indicated in table 2 into formula 2, the following is obtained.

$$W_3/2 + W_4 + m \times (W_3 + W_4) = 350/2 + 100 + m \times (350 + 100) = 275 + m \times 450$$

That is to say, the center positions of the glass fiber bundles 44 in the width direction are located at 275 µm, 725 µm, 1175 µm . . . in a X+ direction from the origin position (toward the right side of the sheet on which FIG. 12 is depicted).

Next, in step S205, the fiber bundle position calculating unit 96C calculates the region where the glass cloth is located with respect to the origin position, in the other one of the insulating layers (prepreg layer A) adjacent to the wiring patterns (third layer) to be designed. The calculation is performed based on the information extracted at step S202 and the origin position determined at step S203. In the example of table 2, the widths $W_1$ and $W_3$ and the intervals $W_2$ and $W_4$ are all the same for the core layer A and the prepreg layer A, and therefore the same calculation results as those of step S204 are obtained.

Next, in step S206, the fiber bundle position calculating unit 96C determines regions where the wiring patterns may be laid out (wiring pattern layout regions). The wiring pattern layout regions are where the glass cloth in one of the insulating layers adjacent to the wiring patterns and the glass cloth in the other one of the insulating layers adjacent to the wiring patterns overlap each other in a planar view. In the example of table 2, the widths $W_1$ and $W_3$ and the intervals $W_2$ and $W_4$ are all the same for the core layer A and the prepreg layer A. Therefore, the wiring pattern layout regions may be calculated based on the center positions of the glass fiber bundles in the width direction calculated at steps S204 and S205 and the information of the widths $W_1$ and $W_3$ extracted at step S202.

When the widths and the intervals of the glass fiber bundles in one of the insulating layers adjacent to the wiring patterns are different from the widths and the intervals of the glass fiber bundles in the other one of the insulating layers adjacent to the wiring patterns, the following method is to be taken. In step S204, the positions of the glass fiber bundles with respect to the origin position are calculated for one of the insulating layers adjacent to the wiring patterns. Then, in step S205, the positions of the glass fiber bundles with respect to the origin position are calculated for the other one of the insulating layers adjacent to the wiring patterns. Then, one of the insulating layers and the other one of the insulating layers are laminated to each other such that the origin position of one of the insulating layers adjacent to the wiring patterns and the origin position of the other one of the insulating layers adjacent to the wiring patterns coincide with each other. Regions where the glass cloth in one of the insulating layers and the glass cloth in the other one of the insulating layers overlap in a planar view (common regions of the glass cloths in the respective insulating layers) are determined as the wiring pattern layout regions.

Wiring patterns may be laid out on selected portions of the wiring pattern layout regions that have been determined by the above method.

When there is only one insulating layer adjacent to the wiring patterns, step S205 may not be performed. When three or more insulating layers are to be laminated to each other, steps S201 through S206 may be repeated according to need.

By obtaining the wiring pattern layout regions by performing steps S201 through S206, the wiring patterns (third layer) are laid out only on regions where the glass cloth (glass fiber bundles 43 and 44) of the core layer A and the glass cloth of the prepreg layer A overlap each other in a planar view. As a result, when a current flows through the wiring patterns (third layer), variations in the impedance, variations in the propagation delay time, and the insertion loss are mitigated compared to the conventional technology.

Figure 13:
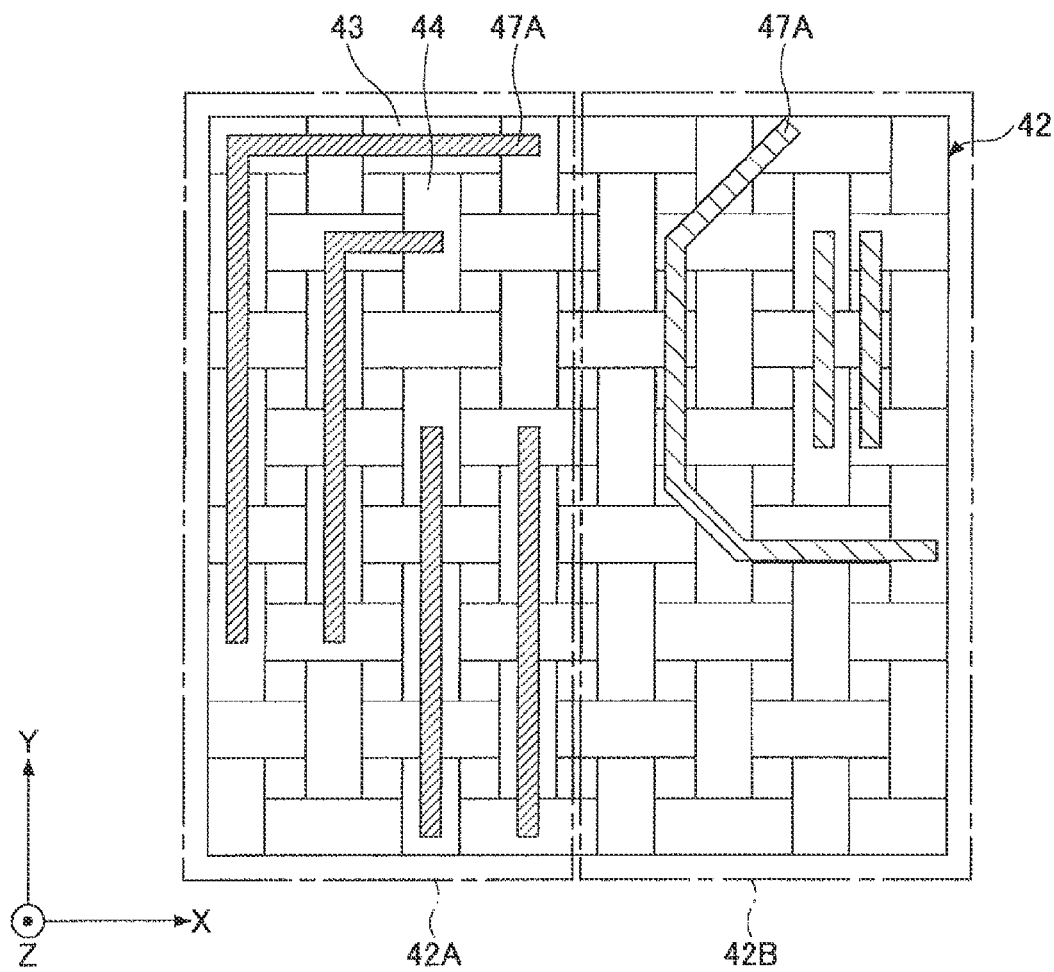
FIG. 13 illustrates an example of dividing an insulating layer into plural regions and forming a wiring pattern.

The core layer A and the prepreg layer A may be divided into plural regions. One or more regions may be selected as a region for laying out wiring patterns used for transmitting high frequency signals, from among the plural regions obtained by the division. In the selected region, the wiring patterns (third layer) are laid out only on positions where the glass cloth (glass fiber bundles 43 and 44) of the core layer A and the glass cloth of the prepreg layer A overlap each other in a planar view. For example, as illustrated in FIG. 13, a core layer A 42 is divided into two regions 42A and 42B. As to the prepreg layer A (not illustrated), the part of the prepreg layer A corresponding to FIG. 13 is also divided into two regions. The region 42A is for disposing wiring patterns used for transmitting high frequency signals (5 GHz or more). The region 42B is for disposing wiring patterns used for transmitting signals of a lower frequency than those of region 42A. In such signals having low frequency, problems relevant to insertion loss, etc., do not arise. The core layer A 42 is not limited to being divided into rectangular regions; the core layer A 42 may be divided into regions of any shape.

In the region 42A, wiring patterns (third layer) 47A are laid out only on positions where the glass cloth (glass fiber bundles 43 and 44) of the core layer A and the glass cloth of the prepreg layer A overlap each other in a planar view. However, in the region 42B, such a condition is not applied; wiring patterns (third layer) 47A may be laid out on any position in the region 42B regardless of the positions of the glass cloths.

As described above, the core layer A and the prepreg layer A may be divided into plural regions. One or more regions may be selected as a region for laying out wiring patterns used for transmitting high frequency signals, from among the plural regions obtained by the division. In the selected region, the wiring patterns (third layer) are laid out only on positions where the glass cloth of the core layer A and the glass cloth of the prepreg layer A overlap each other in a planar view. Meanwhile, in the other region (that is not selected), the wiring patterns (third layer) may be laid out on any position regardless of the positions of the glass cloths of the core layer A and prepreg layer A. These wiring patterns are used for transmitting signals of low frequency, and therefore problems relevant to insertion loss, etc., do not arise. Hence, these wiring patterns may be laid out on any position regardless of the positions of the glass cloths. Accordingly, the degree of freedom in designing the wiring is enhanced.

Figure 14:
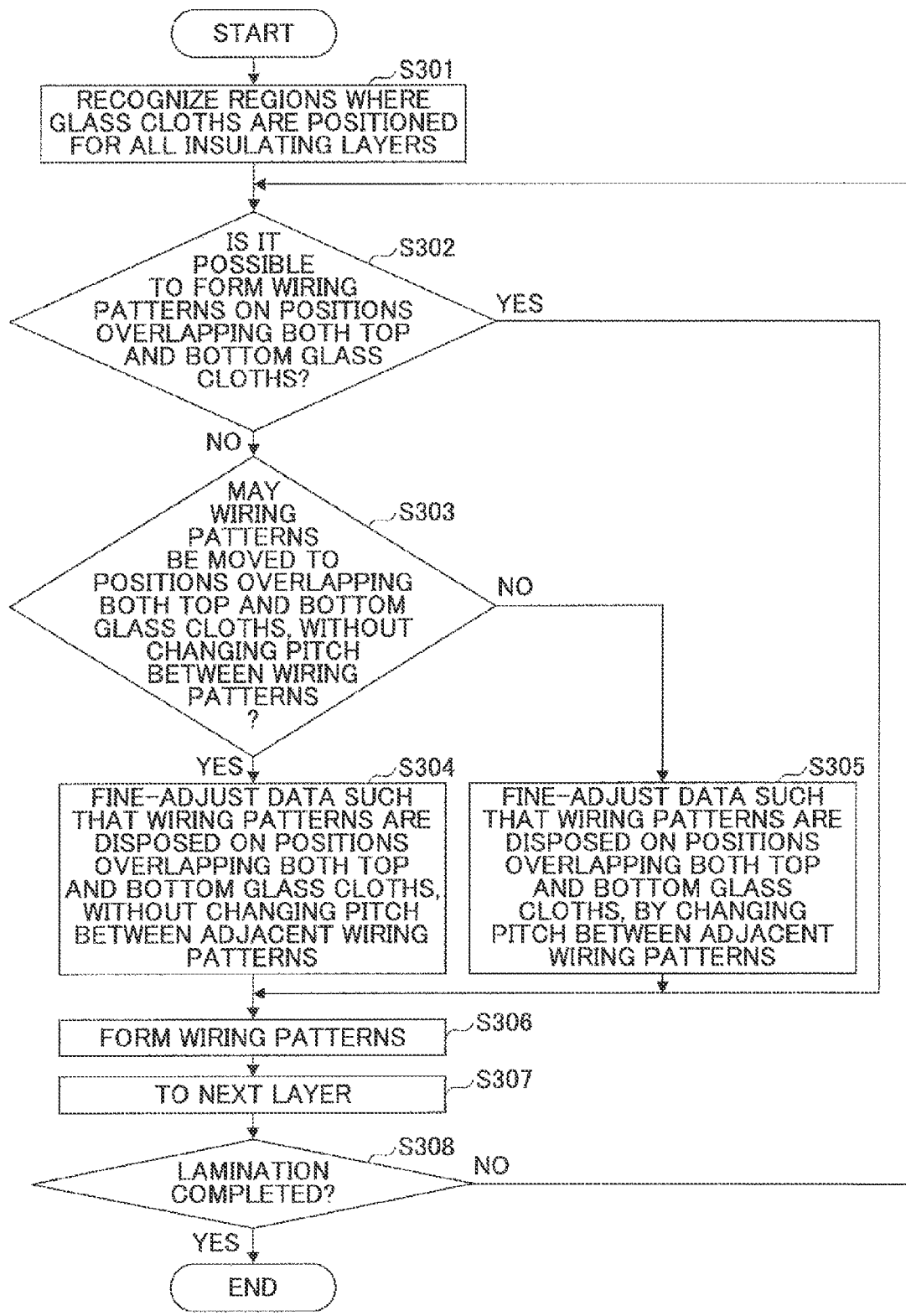
FIG. 14 is a flowchart for manufacturing the wiring substrate.
Figure 15:
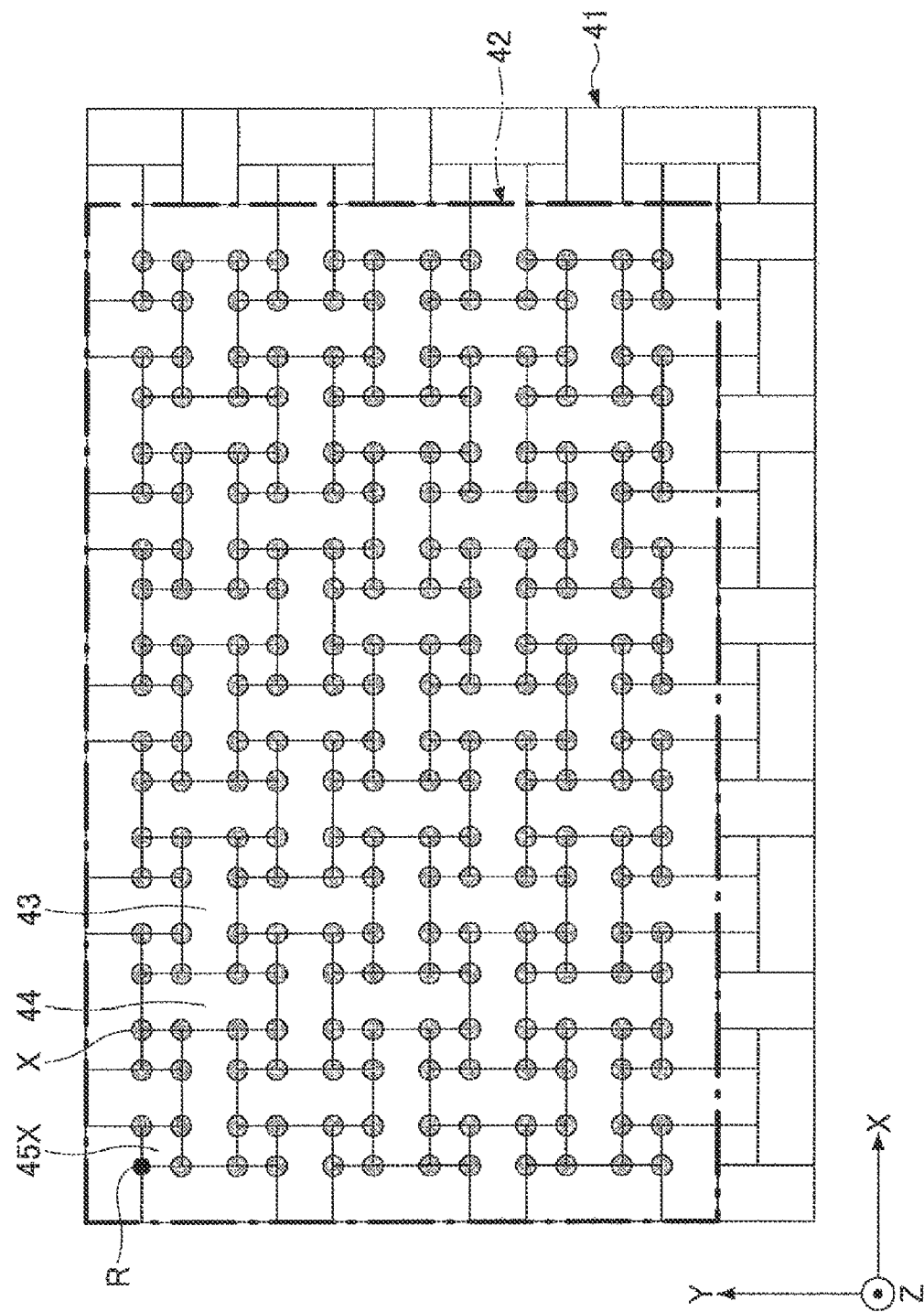
FIG. 15 illustrates procedures for manufacturing the wiring substrate according to the first embodiment of the present invention (part 1)

Next, a detailed description is given of the method of manufacturing a wiring substrate with reference to a flow chart of FIG. 14 illustrating the method of manufacturing a wiring substrate and FIGS. 15 through 20 illustrating procedures for manufacturing the wiring substrate according to the first embodiment of the present invention. The wiring substrate may be manufactured with the use of the wiring substrate manufacturing system 93 including an exposure device, an alignment device, and an etching device. FIGS. 15 through 20 are for describing the core layer A 42 that is an insulating layer adjacent to the bottom side of the wiring patterns (third layer) 47A and a prepreg layer A 52 that is an insulating layer adjacent to the top side of the wiring patterns (third layer) 47A.

First, in step S301, the regions where the glass cloths are positioned are recognized for all insulating layers (all core layers and all prepreg layers). Specifically, a coordinate measurement machine having a function of radiating X-rays is used for radiating X-rays on the insulating layers to perform image recognition of the glass cloths in the insulating layers. Coordinates of all intersection points (all X points in FIG. 15) in the glass cloths with respect to the origin positions R determined in the design stage are calculated. By calculating coordinates of all intersection points in the glass cloths with respect to the origin positions R, the regions where the glass cloths are positioned in the insulating layers are recognized.

Next, in step S302, it is determined whether it is possible to form wiring patterns on positions that overlap any part of the glass cloth in the insulating layer adjacent to the top side in a planar view and that also overlap any part of the glass cloth in the insulating layer adjacent to the bottom side in a planar view.

Figure 16:
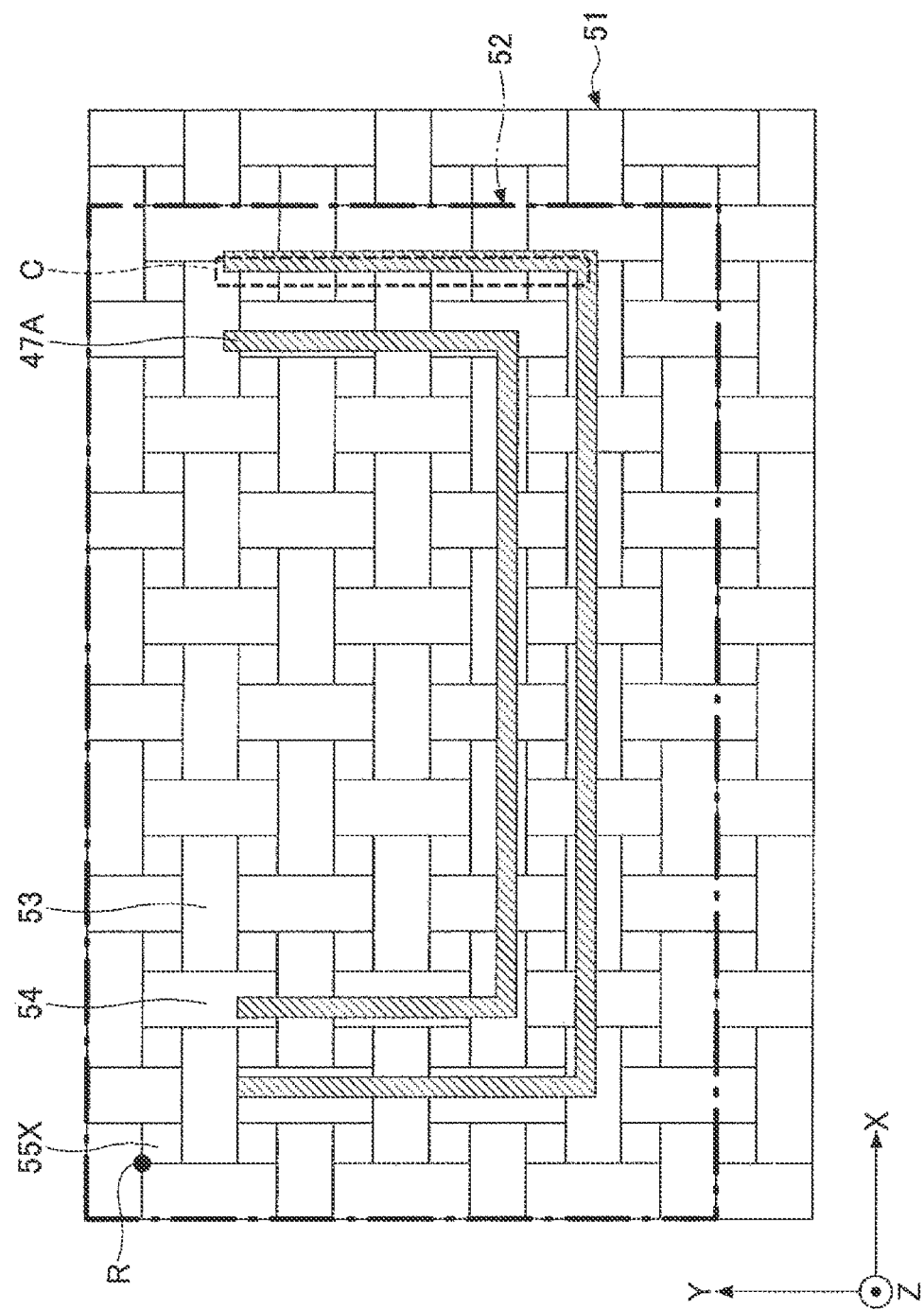
FIG. 16 illustrates procedures for manufacturing the wiring substrate according to the first embodiment of the present invention (part 2)

Specifically, as illustrated in FIG. 16, the design information of the wiring patterns (third layer) 47A (design information relevant to the layout position of the wiring patterns (third layer) 47A with respect to the origin position R) is compared with information of regions where the glass cloth is positioned with respect to the origin position R recognized in step S301. Accordingly, it is determined whether the wiring patterns (third layer) 47A are laid out on positions overlapping any part of the glass cloth (glass fiber bundles 53 and 54) in the prepreg layer A 52 that is the insulating layer adjacent to the top side, in a planar view. In the example of FIG. 16, the part surrounded by dashed lines C of the wiring pattern (third layer) 47A is not laid out on a position that completely overlaps the glass cloth (glass fiber bundle 54) in a planar view.

In FIG. 16, 51 denotes the original version of the prepreg layer A, 52 denotes a region of the prepreg layer A after being cut, 53 denotes the glass fiber bundles that are disposed in a direction parallel to an X axis, 54 denotes the glass fiber bundles that are disposed in a direction parallel to an Y axis, 55X denotes gap portions between the glass fiber bundles 53 and the glass fiber bundles 54, and R denotes an origin position.

Figure 17:
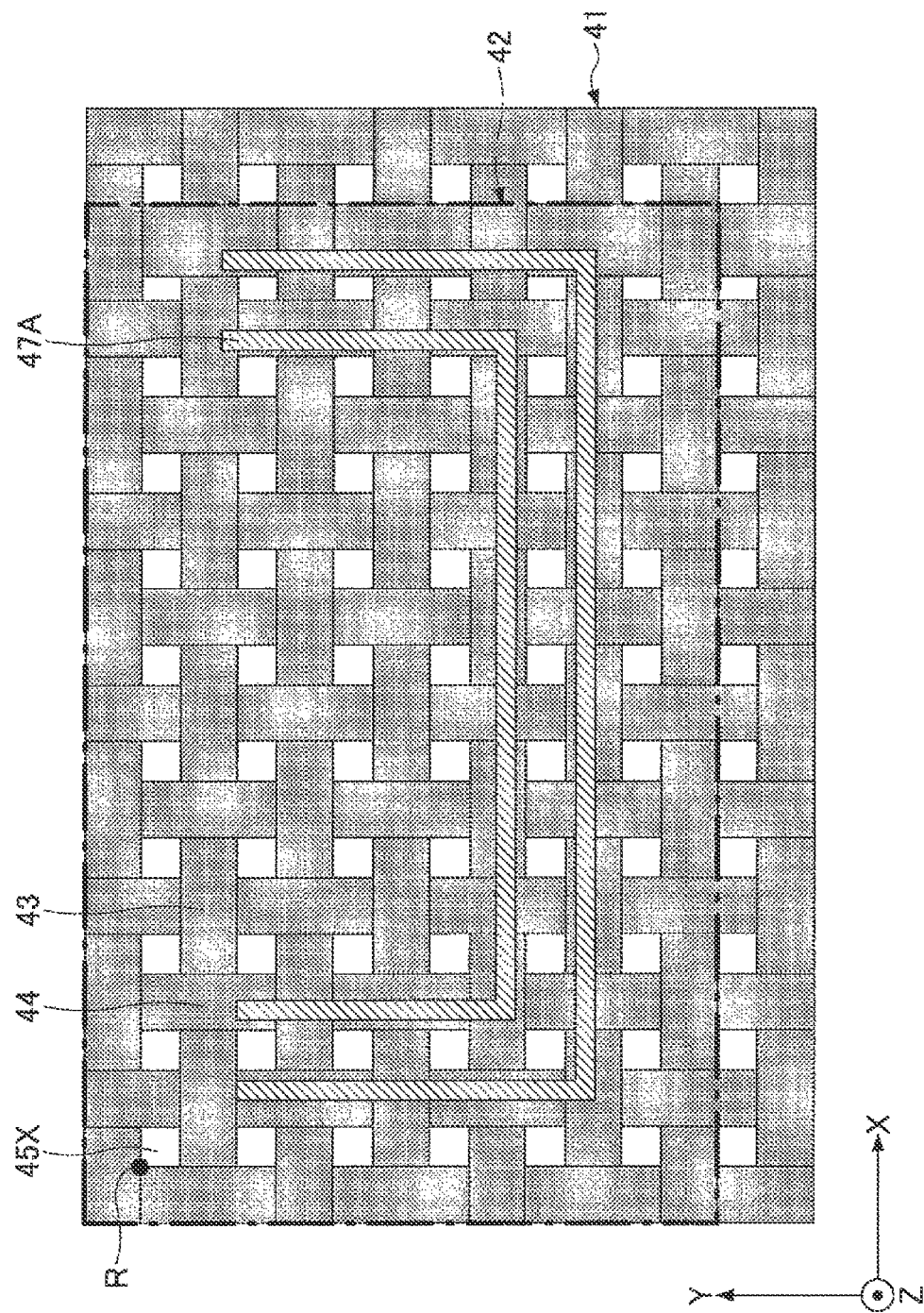
FIG. 17 illustrates procedures for manufacturing the wiring substrate according to the first embodiment of the present invention (part 3)

Next, as illustrated in FIG. 17, the design information of the wiring patterns (third layer) 47A (design information relevant to the layout position of the wiring patterns (third layer) 47A with respect to the origin position R) is compared with information of regions where the glass cloth is positioned with respect to the origin position R recognized in step S301. Accordingly, it is determined whether the wiring patterns (third layer) 47A are laid out on a position overlapping any part of the glass cloth (glass fiber bundles 43 and 44) in the core layer A 42 that is the insulating layer adjacent to the bottom side, in a planar view. In the example of FIG. 17, all of the wiring patterns (third layer) 47A are laid out on positions that completely overlap the glass cloth in a planar view.

Figure 18:
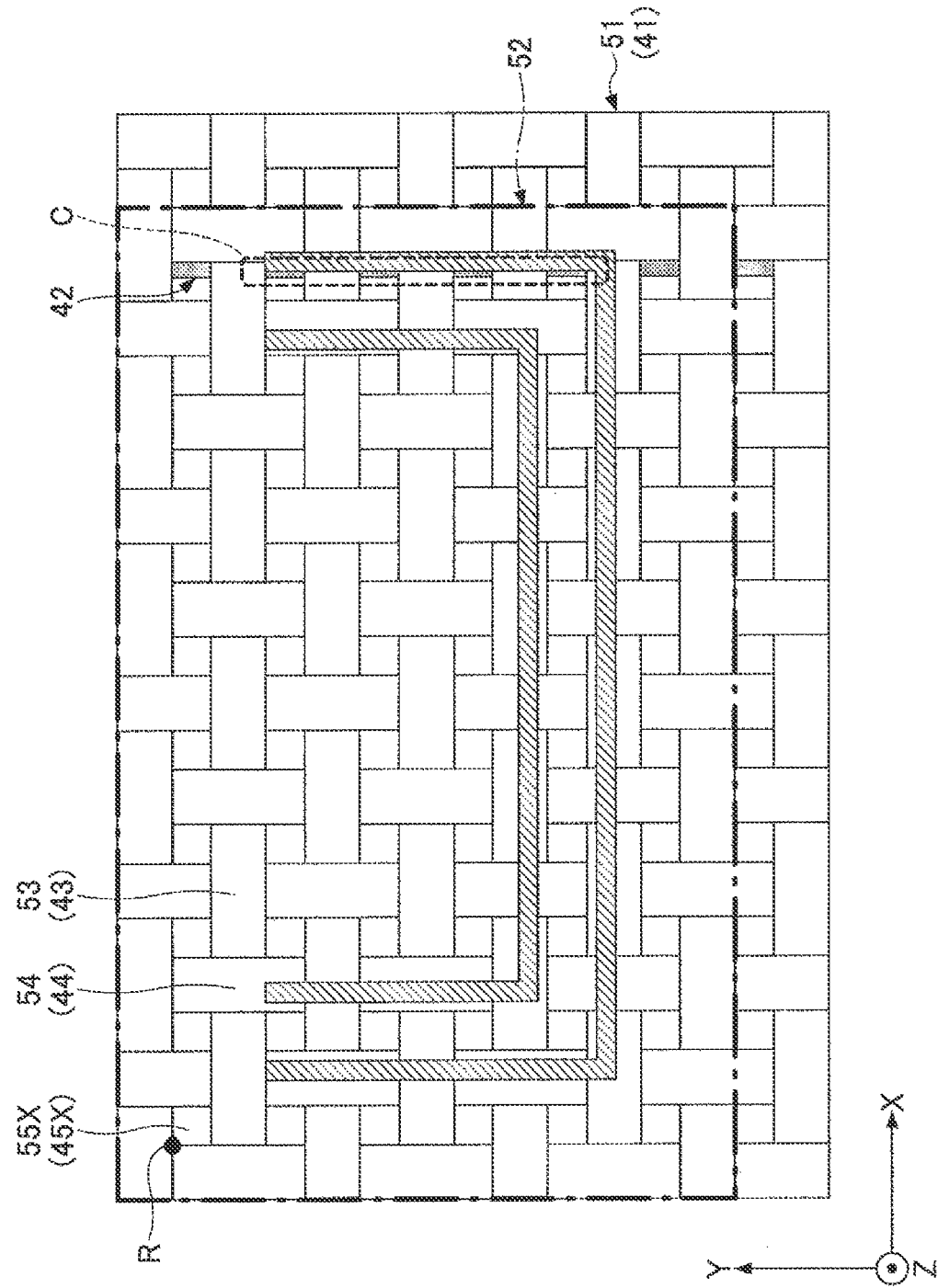
FIG. 18 illustrates procedures for manufacturing the wiring substrate according to the first embodiment of the present invention (part 4)
Figure 20:
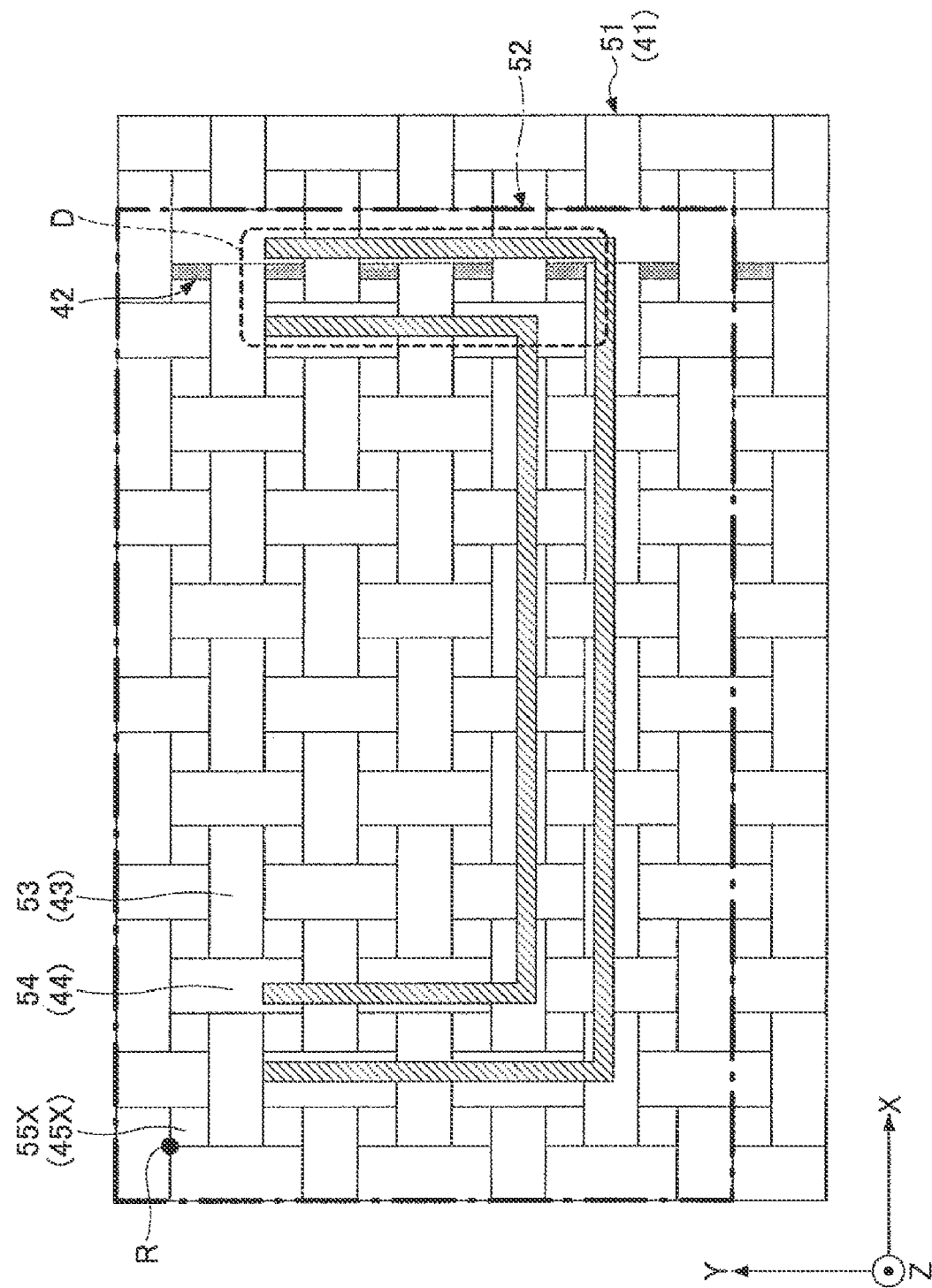
FIG. 20 illustrates procedures for manufacturing the wiring substrate according to the first embodiment of the present invention (part 6)

Furthermore, as illustrated in FIG. 18, the logical product (AND operation) of the position information items of the glass cloths of the insulating layers adjacent to the top and bottom of the wiring patterns is obtained. Accordingly, it is confirmed whether there are any parts that deviate from the glass cloths of the insulating layers adjacent to the top and bottom of the wiring patterns.

In the example of FIG. 18, the part surrounded by dashed lines C of the wiring pattern (third layer) 47A is laid out on a position overlapping the glass cloth (glass fiber bundle 44) of the core layer A 42 that is an insulating layer adjacent to the bottom side in a planar view, but is not laid out on a position overlapping the glass cloth (glass fiber bundles 53 and 54) of the prepreg layer A 52 that is an insulating layer adjacent to the top side in a planar view.

The wiring patterns are designed to be formed on positions that overlap any part of the glass cloth in the insulating layer adjacent to the top side in a planar view and that also overlap any part of the glass cloth in the insulating layer adjacent to the bottom side in a planar view. Thus, the wiring patterns are ideally supposed to be formed on positions that overlap any part of the glass cloth in the insulating layer adjacent to the top side in a planar view and that also overlap any part of the glass cloth in the insulating layer adjacent to the bottom side in a planar view. However, due to variations that occur in the process of manufacturing core layers and prepreg layers, there may be cases where the position of the glass cloth deviates from the design position. For this reason, steps S301 and S302 are performed for the purpose of determining whether the wiring patterns may be formed on positions of the glass cloths included in the core layer and prepreg layer that are actually used.

When the determination at step S302 is affirmative (YES in step S302), the process proceeds to step S306. In step S306, the wiring patterns are formed. With reference to FIGS. 19A through 19E, a description is given of an example of forming the wiring patterns (third layer) 47A between a core layer A (original version) 41 that is the insulating layer adjacent to the bottom side and a prepreg layer A (original version) 51 that is the insulating layer adjacent to the top side.

First, as illustrated in FIG. 19A, the core layer A (original version) 41 is prepared, and metal foil 47, which is a conducting layer, is adhered on one side of the prepared core layer A (original version) 41. In FIG. 19A, 46 denotes insulating resin. The insulating resin 46 may be made of a material such as epoxy resin, polyimide resin, polyester resin, or the like. The insulating resin 46 may include a filler such as silica, alumina, or the like. The metal foil 47 may be made of any material as long as it is a conducting body, such as Cu foil, Al foil, Au foil, Ag foil, or the like. The metal foil 47 becomes the wiring patterns (third layer) 47A in the final product. The thickness of the metal foil 47 may be, for example, 18 μm, although it is not particularly limited. Next, as illustrated in FIG. 19B, a photosensitive resist layer 48 is formed so as to cover the metal foil 47. The resist layer 48 may be, for example, a photosensitive resin composition.

Next, a mask (not illustrated) for forming the wiring patterns (third layer) 47A is prepared. The prepared mask is for fabricating wiring patterns designed to be laid out in the wiring pattern layout regions calculated by steps S201 through S206 of FIG. 11. A positioning mark is attached to a position of the mask corresponding to the origin position. X-rays are radiated to the structure illustrated in FIG. 19B to recognize the origin position R. The mask is disposed on the structure illustrated in FIG. 19B such that the recognized origin position R and the positioning mark on the mask satisfy a predetermined positional relationship. Then, the resist layer 48 is subjected to exposing and developing procedures via the mask. Accordingly, as illustrated in FIG. 19C, a resist layer 48A is formed on the metal foil 47 at positions corresponding to where the wiring patterns (third layer) 47A are to be formed.

Next, as illustrated in FIG. 19D, the resist layer 48A is used as a mask to etch the metal foil 47. Subsequently, the resist layer 48A is removed, so that the wiring patterns (third layer) 47A are formed. Next, as illustrated in FIG. 19E, the prepreg layer A (original version) 51 is laminated on the core layer A (original version) 41 in such a manner as to cover the wiring patterns (third layer) 47A. Before the lamination, X-rays are radiated on the core layer A (original version) 41 and the prepreg layer A (original version) 51, and the position of the prepreg layer A (original version) 51 with respect to the core layer A (original version) 41 is adjusted so that the origin position of the prepreg layer A (original version) 51 coincides with the origin position of the core layer A (original version) 41.

As described above, the wiring patterns (third layer) 47A are formed on positions that overlap any part of the glass cloth in the core layer A (original version) 41 in a planar view and that also overlap any part of the glass cloth in the prepreg layer A (original version) 51 in a planar view. As a result, when a current flows through the wiring patterns (third layer) 47A, variations in the impedance, variations in the propagation delay time, and the insertion loss are further mitigated than those of the conventional wiring substrate.

FIGS. 19A through 19E illustrate an example of forming wiring patterns by a subtractive method; however, the wiring patterns may be formed by any method other than the subtractive method. Examples of methods of forming wiring patterns are a semi-additive method and an aerosol deposition method.

Referring back to FIG. 14, when the determination at step S302 is negative (NO in step S302), the process proceeds to step S303. In step S303, it is determined as to whether the positions where the wiring patterns are to be formed may be moved to positions that overlap any part of the glass cloth in the insulating layer adjacent to the top side in a planar view and that also overlap any part of the glass cloth in the insulating layer adjacent to the bottom side in a planar view, without changing the pitch between adjacent wiring patterns. Specifically, the design information of the wiring patterns (design information relevant to the layout positions of the wiring patterns with respect to the origin position) is compared with information of regions where the glass cloths are positioned with respect to the corresponding origin positions recognized in step S301. When it is determined that the positions may be moved in step S303 (YES in step S303), the process proceeds to step S304.

In step S304, a mask is fabricated upon fine-adjusting data used for fabricating the mask. That is, the data is adjusted such that the wiring patterns are formed on positions that overlap any part of the glass cloth in the insulating layer adjacent to the top side in a planar view and that also overlap any part of the glass cloth in the insulating layer adjacent to the bottom side in a planar view, without changing the pitch between adjacent wiring patterns. Specifically, in the design data, the wiring patterns (third layer) 47A are moved without changing the pitch between adjacent wiring patterns (e.g., plural wiring patterns are shifted in parallel without changing the interval between them), such that all of the wiring patterns (third layer) 47A (including the part surrounded by the dashed lines C in FIG. 18) are formed on positions that overlap any part of the glass cloth (glass fiber bundles 53 and 54) in the prepreg layer A 52 that is the insulating layer adjacent to the top side in a planar view, and that also overlap any part of the glass cloth (glass fiber bundles 43 and 44) in the core layer A 42 that is the insulating layer adjacent to the bottom side in a planar view (see part surrounded by dashed lines D in FIG. 20). Then, the data used for fabricating the mask is fine-adjusted based on the design data of the wiring patterns (third layer) 47A in which the patterns have been moved, and the mask is fabricated. Then, step S306 is executed with the use of the fabricated mask.

When the determination at step S303 is negative (NO in step S303), the process proceeds to step S305. In step S305, in the design data, the pitch between adjacent wiring patterns is changed (e.g., only one of the two wiring patterns is shifted such that the interval between the two wiring patterns is changed), so that the wiring patterns are formed on positions that overlap any part of the glass cloth in the insulating layer adjacent to the top side in a planar view and that also overlap any part of the glass cloth in the insulating layer adjacent to the bottom side in a planar view. The pitch between adjacent wiring patterns is changed by an amount within an allowable range that is set in advance, and by a minimum amount. Then, the data used for fabricating the mask is finely adjusted based on the design data of the wiring patterns (third layer) 47A in which the pitch has been changed, and the mask is fabricated. Then, step S306 is executed with the use of the fabricated mask.

After executing step S306, the wiring patterns and the insulating layers are laminated to each other (step S307). In step S308, it is determined whether all wiring patterns and insulating layers have been laminated to each other. When the determination in step S308 is affirmative (YES in step S308), the manufacturing method of the wiring substrate ends. When the determination in step S308 is negative (NO in step S308), the process returns to step S302, and the above-described steps are repeated.

As described above, the wiring patterns are formed only in regions that overlap both the glass cloth in one of the adjacent insulating layers and also the glass cloth in the other one of the adjacent insulating layers in a planar view.

In step S305, there may be a case where even if the pitch between wiring patterns is changed, it is not possible to form the wiring patterns on positions that overlap any part of the glass cloth in the insulating layer adjacent to the top side in a planar view and that also overlap any part of the glass cloth in the insulating layer adjacent to the bottom side in a planar view. In this case, the two wiring patterns used for transmitting differential signals are formed such that they deviate from the glass cloths by substantially the same length, in order to minimize the skew.

Furthermore, there may be a case where it is determined that there are sufficient design margins, even in consideration of presumable variations in the positions of the glass cloths in the core layer and the prepreg layer due to variations in the manufacturing process (manufacturing errors). In this case, it is determined that the wiring patterns would be consistently be formed on the glass cloth. Therefore, the wiring patterns are formed only in regions that overlap both the glass cloth in one of the adjacent insulating layers and also the glass cloth in the other one of the adjacent insulating layers in a planar view, without having to move the wiring patterns. Thus, steps S301 through S305 of FIG. 14 may be omitted in this case. Specifically, step S306 only consists of radiating X-rays on the structure illustrated in FIG. 19B to recognize the origin position R. Then, the mask is disposed on the structure illustrated in FIG. 19B such that the recognized origin position R and the positioning mark on the prepared mask satisfy a predetermined positional relationship. Accordingly, the wiring patterns are formed only in regions that overlap both the glass cloth in one of the adjacent insulating layers and also the glass cloth in the other one of the adjacent insulating layers in a planar view. This method is significantly advantageous in terms of mass production.

As described above, according to the first embodiment of the present invention, even when there are variations in the positions of the glass cloths in the core layer and the prepreg layer due to variations in the manufacturing process (manufacturing errors), the wiring patterns are formed only in regions that overlap both the glass cloth in one of the adjacent insulating layers and also the glass cloth in the other one of the adjacent insulating layers in a planar view. Consequently, when a current flows through the wiring patterns, variations in the impedance, variations in the propagation delay time, and the insertion loss are further mitigated than those of the conventional wiring substrate.

Accordingly, as the variations in the impedance, variations in the propagation delay time, and the insertion loss are further mitigated than those of the conventional wiring substrate, high frequency signal transmission may be implemented with good performance without having to limit the lengths of the wiring patterns or change the widths of the wiring patterns. Particularly, the higher the transmission frequency becomes, the larger the effect of mitigating variations in the impedance, variations in the propagation delay time, and the insertion loss. Therefore, excellent effects are achieved in high frequency signal transmission exceeding 20 Gbps, such as 100 GBit·Ethernet (registered trademark).

Second Embodiment

Figure 21:
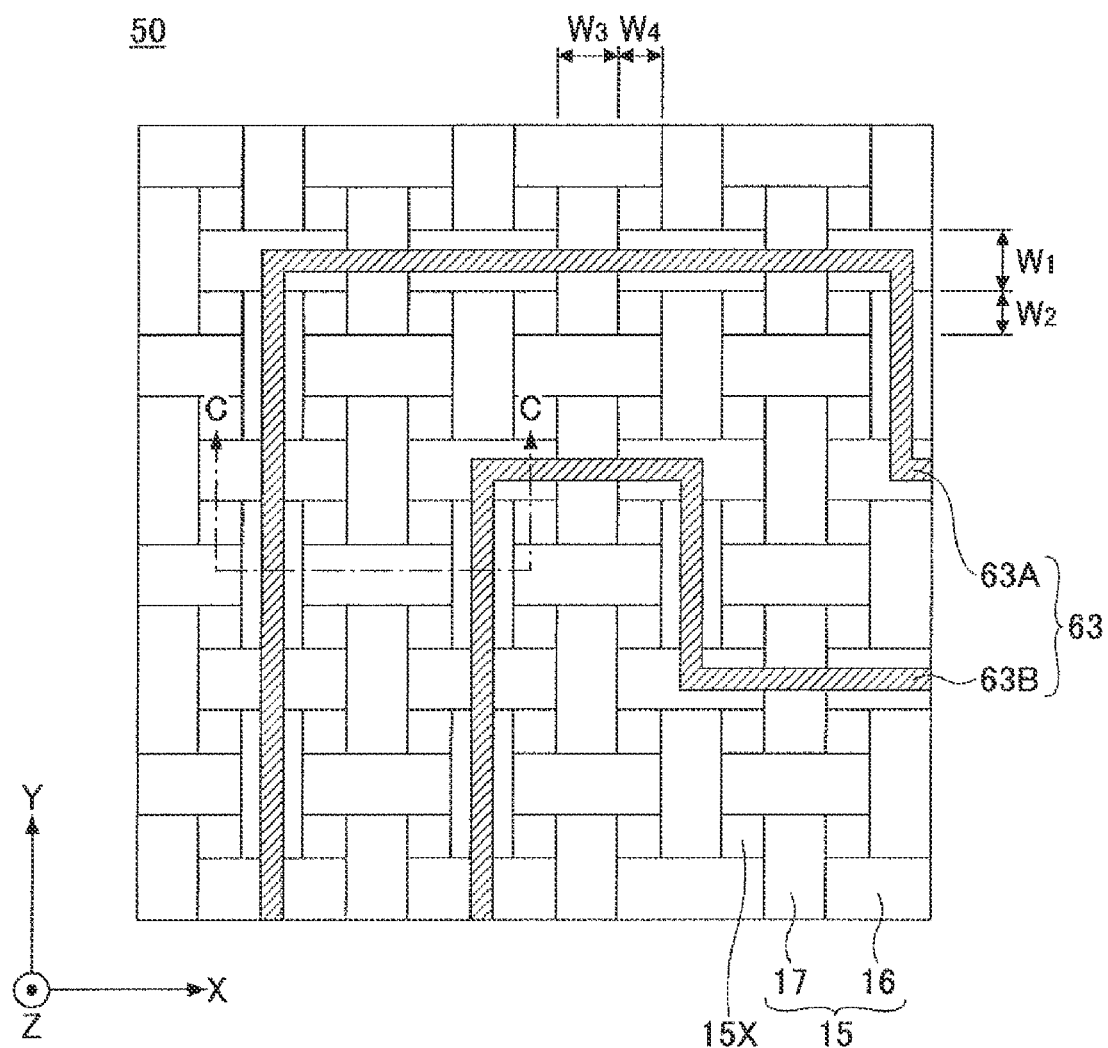
FIG. 21 is a transparent plan view of main parts of a wiring substrate according to a second embodiment of the present invention.
Figure 22:
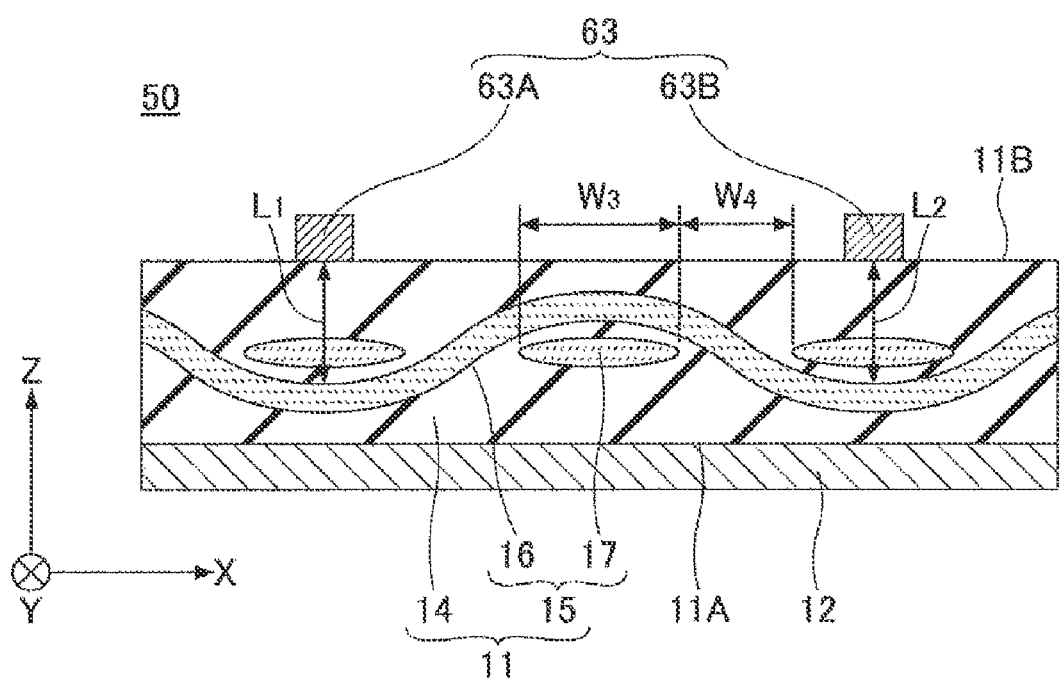
FIG. 22 is a cross-sectional view of main parts of the wiring substrate according to the second embodiment of the present invention.

FIG. 21 is a transparent plan view of main parts of a wiring substrate according to a second embodiment of the present invention. FIG. 22 is a cross-sectional view of main parts of the wiring substrate according to the second embodiment of the present invention. The wiring pattern 12 and the insulating resin 14 illustrated in FIG. 22 are not illustrated in FIG. 21. FIG. 22 is a cross-sectional view cut along a line C-C in FIG. 21. In FIGS. 21 and 22, elements corresponding to those of FIGS. 3 through 5 are denoted by the same reference numerals and may not be further described.

In FIGS. 21 and 22, a wiring substrate 50 has the same structure as the wiring substrate 10 according to the first embodiment, except that the wiring patterns 13 are replaced with wiring patterns 63 in FIGS. 21 and 22. In the following description of the wiring substrate 50, elements corresponding to those of the wiring substrate 10 are not further described and only the differences are described.

In the wiring substrate 50, the individual wiring patterns 63 are referred to as a wiring pattern 63A and a wiring pattern 63B. The wiring pattern 63A and the wiring pattern 63B, which are used for transmitting differential signals, are disposed parallel to each other. Furthermore, the wiring pattern 63A and the wiring pattern 63B are formed only on positions that overlap any part of the glass cloth 15 in a planar view from the second surface 11B of the prepreg layer 11. The wiring pattern 63A and the wiring pattern 63B are not formed on positions that overlap the gap portions 15X of the glass cloth 15 in a planar view. Furthermore, the wiring pattern 63A and the wiring pattern 63B are disposed such that one glass fiber bundle 16 or one glass fiber bundle 17 is consistently located between the wiring patterns 63A and 63B. That is to say, the wiring patterns 63A and 63B are disposed such that the length between the wiring pattern 63A and each glass fiber bundle 16 or 17 that intersects the wiring pattern 63A (i.e., the length in the Z direction) is the same as the length between the wiring pattern 63B and each glass fiber bundle 16 or 17 that intersects the wiring pattern 63B. For example, in FIG. 22, a length $L_1$ between the wiring pattern 63A and the glass fiber bundle 16 (that intersects the wiring pattern 63A) is the same as a length $L_2$ between the wiring pattern 63B and the glass fiber bundle 16 (that intersects the wiring pattern 63B).

As described above, according to the second embodiment of the present invention, the wiring patterns, which are used for transmitting differential signals, are disposed parallel to each other. Furthermore, the wiring patterns are formed only on positions that overlap any part of the glass cloth in a planar view on the insulating layer. Furthermore, the parallel wiring patterns, which are used for transmitting differential signals, are disposed such that the length between one of the wiring patterns and each glass fiber bundle that intersects the one of the wiring patterns (i.e., the length in the Z direction) is the same as the length between the other one of the wiring patterns and each glass fiber bundle that intersects the other one of the wiring patterns. Accordingly, the length between the wiring patterns and the glass fiber bundles parallel to the corresponding wiring patterns is the same for both of the parallel wiring patterns, and the length between the wiring patterns and the glass fiber bundles intersecting the corresponding wiring patterns is also the same for both of the parallel wiring patterns. Consequently, when a current flows through the wiring patterns 63 according to the second embodiment of the present invention, variations in the impedance, variations in the propagation delay time, and the insertion loss are further mitigated than those of the first embodiment of the present invention.

The same effects are achieved when the number of glass fiber bundles located between the parallel wiring patterns used for transmitting differential signals is an odd number other than one.

Third Embodiment

In a third embodiment according to the present invention, a description is given of a semiconductor device in which a semiconductor chip is installed on the wiring substrate. In the third embodiment, elements corresponding to those of the first or second embodiments are not further described, and the differences are mainly described.

FIG. 23 is a cross-sectional view of a semiconductor device according to the third embodiment of the present invention. In FIG. 23, elements corresponding to those of FIG. 8 are denoted by the same reference numerals and may not be further described. As illustrated in FIG. 23, a semiconductor device 60 includes a wiring substrate 20D, a semiconductor chip 70, and connection parts 80. On the wiring substrate 20D, a solder resist layer 38 having opening parts 38X is formed on the wiring substrate 20A illustrated in FIG. 8. The wiring patterns 33 are partially exposed through the opening parts 38X.

The semiconductor chip 70 includes a semiconductor integrated circuit (not illustrated) formed by disposing a diffusion layer, an insulating layer, via holes, wirings, electrode pads, etc., on a semiconductor substrate made of, for example, silicon. Electrode pads 71 of the semiconductor chip 70 are electrically connected to the wiring patterns 33 exposed through the opening parts 38X of the wiring substrate 20D via the connection parts 80. The connection parts 80 may be made of Au bumps, solder bumps, or the like. Underfill resin may be supplied in the gap between the semiconductor chip 70 and the wiring substrate 20D.

As described above, according to the third embodiment of the present invention, a semiconductor device including a semiconductor chip installed on a wiring substrate is implemented, in which when a current flows through the wiring patterns, variations in the impedance, variations in the propagation delay time, and the insertion loss are further mitigated than those of the conventional technology.

According to an embodiment of the present invention, a manufacturing method of a wiring substrate and a design method of a wiring substrate are provided, with which variations in the impedance, variations in the propagation delay time, and the insertion loss are mitigated when a current flows through the wiring patterns.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a wiring substrate comprising:
    forming a conducting layer on a first insulating layer including a plurality of first glass fiber bundles;
    forming a photosensitive resist layer on the conducting layer;
    recognizing a first origin position on the first insulating layer;
    forming a mask on the resist layer by positioning the mask with respect to the first origin position, the mask being formed so as to position wiring patterns only on positions overlapping the first glass fiber bundles in a planar view; and
    exposing the resist layer via the mask and forming the wiring patterns only on the positions overlapping the first glass fiber bundles in the planar view.

2. The method according to claim 1, further comprising:
    laminating a second insulating layer including a plurality of second glass fiber bundles so as to cover the wiring patterns on the first insulating layer, wherein
    said laminating the second insulating layer includes recognizing the first origin position on the first insulating layer and a second origin position on the second insulating layer, and laminating the second insulating layer on the first insulating layer such that the second origin position of the second insulating layer coincides with the first origin position of the first insulating layer, and
    said exposing the resist layer and forming the wiring patterns includes forming the wiring patterns only on the positions overlapping both the first glass fiber bundles included in the first insulating layer and the second glass fiber bundles included in the second insulating layer.

3. The method according to claim 1, wherein
    said recognizing the first origin position includes recognizing the first origin position by radiating an X-ray onto the first insulating layer.

4. The method according to claim 2, wherein
    said laminating the second insulating layer includes recognizing the first origin position and the second origin position by radiating an X-ray onto the first insulating layer and the second insulating layer.

5. The method according to claim 1, further comprising:
    measuring coordinates of a position of the first glass fiber bundles with respect to the first origin position in the first insulating layer and recognizing a region of the first glass fiber bundles based on the coordinates, said measuring the coordinates being performed before said forming the conducting layer; and
    acquiring design information relevant to the positions where the wiring patterns are positioned with respect to the first origin position; and
    determining whether it is possible to form the wiring patterns only on the positions overlapping the first glass fiber bundles in the planar view, based on the region of the first glass fiber bundles recognized in said measuring the coordinates and the design information acquired in said acquiring the design information relevant to the positions where the wiring patterns are positioned.

6. The method according to claim 5, wherein
    said measuring the coordinates includes recognizing the region of the first glass fiber bundles by performing image recognition of the first glass fiber bundles by radiating X-rays onto the first insulating layer and measuring coordinates of all intersection points in the first glass fiber bundles.

7. The method according to claim 5, wherein
    said determining whether it is possible to form the wiring patterns only on the positions overlapping the first glass fiber bundles in the planar view includes correcting a part of the design information such that the wiring patterns are formed only on the positions overlapping the first glass fiber bundles in the planar view and fabricating the mask used in said forming the mask on the resist layer and said exposing the resist layer and forming the wiring patterns based on the corrected design information, when it is determined that it is not possible to form the wiring patterns only on the positions overlapping the first glass fiber bundles in the planar view.

8. The method according to claim 5, wherein
    said forming a conducting layer, said forming the photosensitive resist layer, said recognizing the first origin position, said forming the mask on the resist layer, and said exposing the resist layer and forming the wiring patterns are performed when it is determined that it is possible to form the wiring patterns only on the positions overlapping the first glass fiber bundles in the planar view.

9. The method according to claim 5, further comprising:
    determining whether it is possible to form the wiring patterns only on the positions overlapping the first glass fiber bundles in the planar view by moving the parallel wiring patterns without changing a pitch between the parallel wiring patterns, the determination being made based on the region of the first glass fiber bundles recognized in said measuring the coordinates and the design information acquired in said acquiring the design information relevant to the positions where the wiring patterns are positioned, said determining whether it is possible to form the wiring patterns only on the positions overlapping the first glass fiber bundles in the planar view by moving the parallel wiring patterns without changing the pitch between the parallel wiring patterns being performed when the wiring patterns include parallel wiring patterns that are used for transmitting differential signals and when it is determined that it is not possible to form the wiring patterns only on the positions overlapping the first glass fiber bundles in the planar view.

10. The method according to claim 9, wherein said determining whether it is possible to form the wiring patterns only on the positions overlapping the first glass fiber bundles in the planar view includes correcting a part of the design information to change the pitch between the parallel wiring patterns such that the wiring patterns are formed only on the positions overlapping the first glass fiber bundles in the planar view, and fabricating, based on the corrected design information, the mask used in said forming the mask on the resist layer and said exposing the resist layer and forming the wiring patterns, when it is determined that it is not possible to form the wiring patterns only on the positions overlapping the first glass fiber bundles in the planar view without changing the pitch between the parallel wiring patterns.

11. The method according to claim 9, wherein said determining whether it is possible to form the wiring patterns only on the positions overlapping the first glass fiber bundles in the planar view includes correcting a part of the design information without changing the pitch between the parallel wiring patterns such that the wiring patterns are formed only on the positions overlapping the first glass fiber bundles in the planar view, and fabricating, based on the corrected design information, the mask used in said forming the mask on the resist layer and said exposing the resist layer and forming the wiring patterns, when it is determined that it is possible to form the wiring patterns only on the positions overlapping the first glass fiber bundles in the planar view without changing the pitch between the parallel wiring patterns.

12. The method according to claim 10, wherein the pitch is changed within an allowable range that is set in advance, and by a minimum amount.

\* \* \* \* \*